(12) United States Patent
Jonckheere et al.

(10) Patent No.: US 9,086,638 B2
(45) Date of Patent: Jul. 21, 2015

(54) DETECTION OF CONTAMINATION IN EUV SYSTEMS

(75) Inventors: Rik Jonckheere, Muizen (BE); Anne-Marie Goethals, Oud-Heverlee (BE); Gian Francesco Lorusso, Overijse (BE); Ivan Pollentier, Langdorp (BE)

(73) Assignee: IMEC, Leuven (BE)

( * ) Notice: Subject to any disclaimer, the term of this patent is extended or adjusted under 35 U.S.C. 154(b) by 671 days.

(21) Appl. No.: 13/282,175

(22) Filed: Oct. 26, 2011

(65) Prior Publication Data

US 2012/0099092 A1    Apr. 26, 2012

Related U.S. Application Data

(63) Continuation of application No. 12/236,446, filed on Sep. 23, 2008, now abandoned.

(30) Foreign Application Priority Data

Oct. 23, 2007  (EP) .................................... 07119107

(51) Int. Cl.
*G03B 27/52* (2006.01)
*G03B 27/54* (2006.01)
*G03B 27/32* (2006.01)
*G03B 27/72* (2006.01)
*G03F 7/20* (2006.01)
*G03B 27/68* (2006.01)

(52) U.S. Cl.
CPC .......... *G03F 7/70916* (2013.01); *G03F 7/7085* (2013.01); *Y10T 29/49* (2015.01)

(58) Field of Classification Search
CPC .......... G03F 7/7085; G03F 7/70908–7/70916; G03F 7/70958; G03F 7/70591; G03F 7/702

USPC .......... 355/30, 52, 53, 67–71, 77; 250/492.1, 250/492.2, 492.22, 548
See application file for complete search history.

(56) References Cited

U.S. PATENT DOCUMENTS

| | | |
|---|---|---|
| 6,449,086 B1 | 9/2002 | Singh |
| 2002/0083409 A1 | 6/2002 | Hamm |
| 2002/0084425 A1 | 7/2002 | Klebanoff et al. |
| 2004/0056196 A1 | 3/2004 | Yoshida et al. |
| 2004/0227102 A1 | 11/2004 | Kurt et al. |
| 2005/0087699 A1 | 4/2005 | Miyake |
| 2005/0173647 A1 | 8/2005 | Bakker |
| 2006/0066824 A1 | 3/2006 | Knappe et al. |
| 2006/0066940 A1 | 3/2006 | Trenkler et al. |
| 2006/0082751 A1 | 4/2006 | Moors et al. |
| 2006/0114615 A1 | 6/2006 | Pinarbasi |
| 2007/0280852 A1 | 12/2007 | Skubal et al. |
| 2007/0285643 A1 | 12/2007 | Wedowski et al. |

OTHER PUBLICATIONS

Dean et al., Effects of Material Design on Extreme Ultraviolet (EUV) Resist Outgassing, Proceedings of SPIE, vol. 6153, 61531E, Mar. 29, 2006, pp. 1-9.

*Primary Examiner* — Christina Riddle
(74) *Attorney, Agent, or Firm* — Knobbe Martens Olson & Bear LLP

(57) ABSTRACT

A sensor for sensing contamination in an application system is disclosed. In one aspect, the sensor comprises a capping layer. The sensor is adapted to cause a first reflectivity change upon initial formation of a first contamination layer on the capping layer when the sensor is provided in the system. The first reflectivity change is larger than an average reflectivity change upon formation of a thicker contamination layer on the capping layer and larger than an average reflectivity change upon formation of an equal contamination on the actual mirrors of the optics of the system.

19 Claims, 28 Drawing Sheets

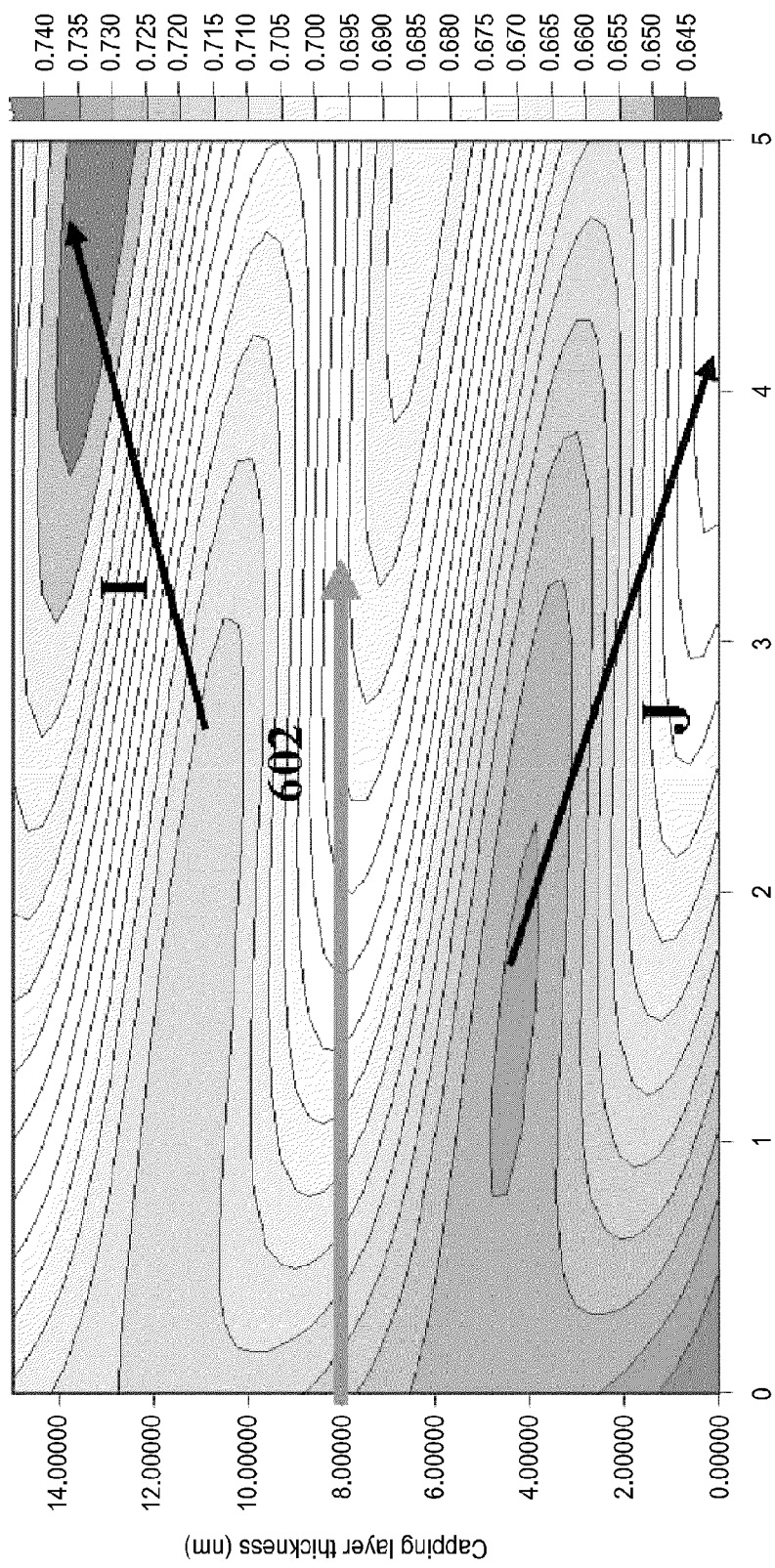

DETECTION OF CONTAMINATION IN EUV SYSTEMS

CROSS-REFERENCE TO RELATED APPLICATIONS

This application is a continuation of U.S. patent application Ser. No. 12/236,446, filed Sep. 23, 2008, titled "DETECTION OF CONTAMINATION IN EUV SYSTEMS," which application is hereby incorporated by reference in its entirety.

BACKGROUND OF THE INVENTION

1. Field of the Invention

The present invention relates to the field of lithographic processing. More particularly, the present invention relates to methods and systems for optimizing lithographic processing, e.g. extreme ultraviolet lithography, e.g. to methods and devices for measuring and/or studying contamination, like carbon contamination, in a lithographic processing system.

2. Description of the Related Technology

Optical lithography nowadays uses wavelengths of 248 nm or 193 nm. With 193 nm immersion lithography integrated circuit (IC) manufacturing is possible down to 45 nm or even down to 32 nm node. However for printing in sub-32 nm half pitch node, this wavelength is probably not satisfactory due to theoretical limitations, unless double patterning is used. Instead of using wavelengths of 193 nm, a more advanced technology has been introduced, also referred to as extreme ultraviolet lithography (EUV lithography), which uses wavelengths of 10 nm to 14 nm, with as typical value 13.5 nm. This technique was in its earlier stages referred to as soft X-ray lithography, more specifically using wavelengths in the range of 2 nm to 50 nm, but then did not yet make use of reduction optics as typically used in optical lithography.

In optical lithography at some wavelengths in the deep ultra violet (DUV) range, the electromagnetic radiation is transmitted by most materials, including glass used for conventional lenses and masks.

At short wavelengths however, e.g. for extreme ultraviolet lithography and soft X-ray lithography, the electromagnetic radiation is absorbed by most materials, including glass used for conventional lenses and masks. Therefore a completely different tool is necessary for performing EUV lithography compared to conventional optical lithography. Instead of using lenses, such an imaging system presently relies on all-reflective optics and therefore is composed of reflective optical elements, also referred to as catoptric elements, for example mirrors. These reflective optical elements, e.g. mirrors preferably are coated with multi-layer structures designed to have a high reflectivity (up to about 70%) at the 13.5 nm wavelength. Furthermore, since air will also absorb EUV light, a vacuum environment is necessary.

Although EUV lithography is considered applicable using wavelengths less than about 32 nm, still a lot of problems need to be overcome to reach a mature technology. Major issues in EUVL are providing a reliable high power source and collector module, obtaining appropriate resist properties, obtaining a defect free mask, having an appropriate reticle protection and obtaining good projection and illuminator optics quality and lifetime. One of the issues relates to contamination of the optics by chemical components, also referred to as "contamination", which components are usually gaseous components originating from outgassing of the resist. This resist outgassing occurs due to the EUV irradiation of the EUV resist.

Such outgassing affects the reflectivity of the optical elements used, as contamination reduces the reflectivity of the reticle as well as of the imaging optics, and this results in a fast deterioration of the overall imaging quality. Following the international technology roadmap for semiconductors (ITRS) the organic material outgas sing rate for 2 minutes under the lens should be lower than about 5e13 molecules/$cm^2$ per second.

In order to reduce the resist outgas sing rate, metrology tools are necessary which are able to measure the amount of resist outgassing for certain resists. One possibility for screening resist outgassing is also described in a publication of K. R. Dean et al in Proc. of SPIE 6153E, p. 1-9 (2006). An outgassing chamber is built on a synchrotron beam line. Together with the wafers, a $Si_3N_4$ witness plate is put in the chamber and exposed to EUV irradiation. This witness plate is then analyzed with electron spectroscopy for chemical analysis (ESCA) to find evidence of the contamination build up. The contaminants are collected in thermal desorption (TD) tubes. The contaminants in these TD tubes are analyzed by gas chromatography/mass spectroscopy (GC/MS) for chemical analysis. In order to obtain information regarding the real contamination on the different components, the witness plate is to be evaluated in a separate characterization system, thus resulting in a tedious and non-efficient task. Transporting the witness plate from the lithographic system to the characterization system may furthermore lead to further contamination of the witness plate resulting in an inaccurate determination of the contamination due to outgas sing.

SUMMARY OF CERTAIN INVENTIVE ASPECTS

Certain inventive aspects relate to good apparatus or methods for detecting contamination in an optical system, e.g. lithographic system, as well as systems and methods using such contamination detection systems and methods. In certain aspects, an accurate and early detection of contamination can be obtained. In certain aspects, methods and systems are provided allowing in-situ monitoring and evaluating of contamination of the optical system, e.g. lithographic system. In certain aspects, methods and systems are provided allowing to detect contamination before optical components are significantly deteriorated, thus allowing to prevent a too high contamination of the system. In certain aspects, the system for detecting contamination may be cost efficient, in economical cost and/or in effort.

One inventive aspect relates to a sensor for sensing contamination in an application system, the sensor comprising a capping layer, wherein the sensor is adapted so as to cause a first reflectivity change upon initial formation of a first contamination layer on the capping layer when the sensor is provided in the application system, the first reflectivity change being larger than an average reflectivity change upon formation of a thicker contamination layer on the capping layer. In one aspect, a sensor is provided that is highly sensitive to contamination, e.g. carbon contamination. In one aspect, the sensor can be easily manufactured.

The reflectivity of the sensor as function of a thickness of a contamination layer on its capping layer may be a superposition of a decreasing reflectivity function and an oscillating reflectivity function, the capping layer being adapted so that the reflectivity change of the sensor upon initial formation of a first contamination layer on the capping layer, when the sensor is in the application system, corresponds with a falling edge of the oscillating reflectivity function. The falling edge of the oscillating reflectivity function may be at the position where the gradient is the steepest. The sensor device may be designed for use with irradiation using a particular wavelength and the reflectivity of the substrate may be the reflectivity for that particular wavelength. In one aspect, an optical technique may be used for detection of contamination, allowing sensitive detection.

The reflectivity change upon initial contamination of the capping layer may be at least about 0.5% reflectivity reduction per nanometer contamination layer thickness, advantageously at least about 1% reflectivity reduction per nanometer contamination layer thickness, more advantageously at least about 2% reflectivity reduction per nanometer contamination layer thickness. In one aspect, contamination can be detected before it leads to significant deterioration of components in the system to be checked, e.g. of optical components in an EUV lithographic system.

The adaptation of the sensor may be adaptation of one or more of the thickness, material, composition or refractive index of the capping layer. In one aspect, there is some degree of freedom in selecting the material and/or the thickness of the capping layer used. The capping layer may comprise a substantially non-oxidizing material. In one aspect, accurate results regarding the contamination can be obtained. The capping layer may comprise any of silicon, ruthenium or titanium dioxide rhodium, palladium, iridium, platinum, gold, silicon carbide, carbon, boron nitride, silicon nitride or titanium nitride.

The sensor may comprise a reflective substrate comprising a substrate with a reflective multi-layer coating, wherein the adaptation of the sensor may comprise an adaptation of the top layer of the reflective multi-layer coating so that the reflectivity change of the sensor upon initial formation of a first contamination on the capping layer, when the sensor is in the system, corresponds with on a falling edge of the oscillating reflectivity function. The adaptation of the top layer of the reflective multi-layer coating may comprise an adaptation of one or more of the thickness, material, composition or refractive index of the top layer of the reflective multi-layer coating. The capping layer may be the top layer of the reflective multi-layer coating.

The sensor may comprise a sub-layer between the capping layer and the reflective substrate, wherein adaptation of the sensor may comprise adaptation of the sub-layer. The adaptation of the top layer of the reflective multi-layer coating may comprise an adaptation of one or more of the thickness, material, composition or refractive index of the sub-layer.

Another inventive aspect relates to a detection system for detecting contamination in an application system, the detection system comprising a sensor as described above and a processing system for deriving a contamination level as a function of a detected reflectivity of the sensor. In one aspect, detection system may be provided allowing automated or automatic detection of contamination.

The sensor may be adapted for receiving an irradiation beam from an irradiation source (306) and may be adapted for reflecting a modified irradiation beam to a radiation detector (308).

The detection system furthermore may comprise an irradiation source for irradiating the sensor surface. In one aspect, the system may be calibrated for a given irradiation wavelength. The detection system furthermore may comprise a radiation detector for detecting a reflected irradiation beam reflected by the sensor. In one aspect, the system for contamination detection is based on an optical characterization technique resulting in the possibility of checking the contamination level with high resolution.

The processing system for deriving a contamination level may be adapted for taking into account a correlation between the change in reflectivity and the thickness of the contamination layer formed on the sensor. In one aspect, the sensor can be accurately calibrated, thus resulting in accurate results.

The processing system furthermore may be adapted for taking into account a calibration measurement providing information regarding the initial reflectivity of the reflective substrate. In one aspect, the sensor can be accurately calibrated, thus resulting in quantitative results.

The detection system furthermore may comprise a feedback providing system for providing feedback regarding the contamination to the application system. In one aspect, a system providing an automatic and/or automated contamination detection may be obtained.

The detection system furthermore may comprise a contamination removal system for removing the contamination from the capping layer.

Another inventive aspect relates to an application system comprising a sensor as described above or a detection system as described above. The application system may be any system wherein contamination may occur. The application system may be an extreme ultraviolet lithographic system comprising a plurality of mirrors, at least one of the mirrors comprising a capping layer, wherein the at least one mirror may be adapted so as to cause a mirror reflectivity change upon initial formation of a first contamination layer on the capping layer of the at least one mirror, the mirror reflectivity change being substantially smaller than the first reflectivity change for the sensor.

The application system may for example be an extreme ultraviolet lithographic system wherein contamination occurs by outgassing of a resist upon irradiation, residual contamination present in the vacuum, etc. The contamination may be a carbon contamination. It is an advantage that an efficient system may be obtained for detecting contamination in an extreme ultraviolet lithographic system. In one aspect, the sensors allow evaluation of the contamination prior to a critical level of contamination reached at the optical components of the system.

The detection system may be provided with a feedback providing system, the feedback providing system being adapted for controlling an irradiation source of the extreme ultraviolet lithographic processing system. In one aspect, a system is provided that is halted if an inappropriate level of contamination occurs, thus providing an improved quality of the devices that are lithographically processed.

Another inventive aspect relates to a method for sensing contamination in an application system, the method comprising providing a sensor comprising a capping layer and sensing a first reflectivity change of the sensor upon initial formation of a first contamination layer on the capping layer when the sensor is provided in the system, the first reflectivity change being larger than an average reflectivity change upon formation of a thicker contamination layer on the capping layer. In one aspect, accurate and efficient methods for detecting contamination are obtained.

The method further may comprise determining a contamination quantity based on the sensed first reflectivity change. In one aspect, quantitative measurement of contamination may be performed.

The method further may comprise controlling an application system based on the determined contamination quantity. In one aspect, lithographic processing may be performed taking into account the level of contamination present in the system. In some embodiments, the reduced reflectivity of the mirrors used in an EUV system may be compensated by adjusting the irradiation settings.

Another inventive aspect relates to a method for manufacturing a sensor for sensing contamination in an application system, the method comprising obtaining a substrate and providing a capping layer on the substrate thus forming a sensor, the sensor being adapted so as to cause a first reflectivity change upon initial formation of a first contamination layer on the capping layer when the sensor is provided in the system, the first reflectivity change being larger than an average reflectivity change upon formation of a thicker contamination layer on the capping layer. In one aspect, sensors can be easily and accurately manufactured.

Another inventive aspect relates to a sensor device for sensing contamination in an application system, the sensor device obtained using a method for manufacturing as described above.

Another inventive aspect relates to a computer program product for performing, when executed on a processing system, a method for sensing as described above.

Another inventive aspect relates to a machine readable data storage device storing such a computer program product or the transmission thereof over a local or wide area telecommunications network.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The teachings of certain inventive aspects permit the design of improved methods and apparatus for lithographic processing of devices. The above and other characteristics, features and advantages will become apparent from the following detailed description, taken in conjunction with the accompanying drawings, which illustrate, by way of example, the inventive principles. This description is given for the sake of example only, without limiting the scope of the invention. The reference figures quoted below refer to the attached drawings.

BRIEF DESCRIPTION OF THE DRAWINGS

FIG. 6a to FIG. 6d illustrate the effect of the wavelength used for determining reflectivity and of the capping layer thickness on the sensitivity of the reflectivity to deposition/ formation of a contamination layer, illustrating principles that can be used in certain embodiments.

Figure 1:
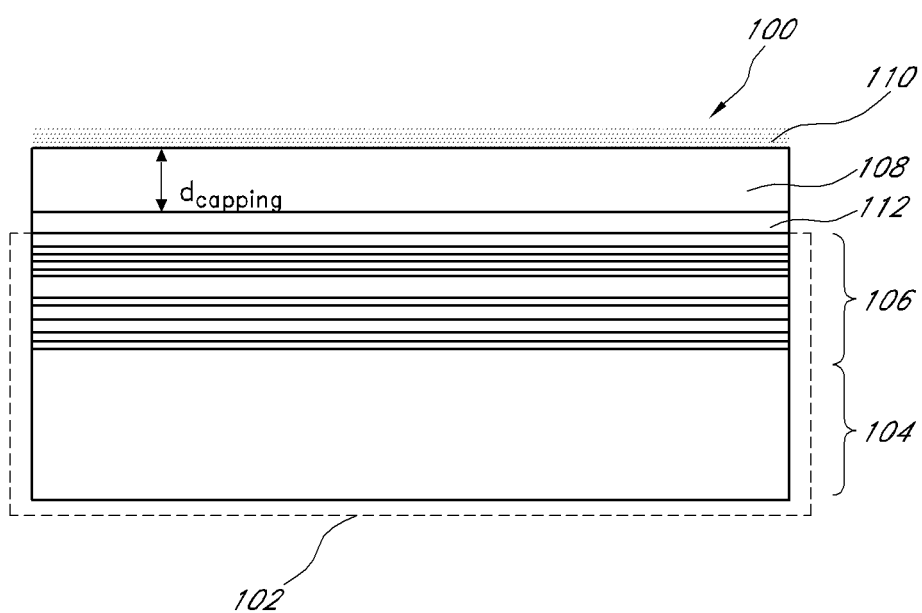
FIG. 1 illustrates a schematic representation of an exemplary sensor according to embodiments of the first aspect of the present invention.

In the different figures, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Similarly, it is to be noticed that the term "coupled" should not be interpreted as being restricted to direct connections only. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present invention. As the following claims reflect, inventive aspects lie in less than all features of a single foregoing disclosed embodiment. Thus, the claims following the detailed description are hereby expressly incorporated into this detailed description, with each claim standing on its own as a separate embodiment of this invention. Furthermore, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

The following terms are provided solely to aid in the understanding of the description. The embodiments are suitable for lithographic systems and methods using electromagnetic radiation with wavelengths having the same order of magnitude or being smaller than the reticle feature thickness. The latter typically includes extreme ultraviolet (EUV) radiation and X-ray radiation. For extreme ultraviolet radiation and X-ray radiation, a number of slightly different definitions are used in the field. Extreme ultraviolet radiation typically may include electromagnetic radiation in the wavelength range of about 31 nm to 1 nm and X-ray radiation typically may include electromagnetic radiation in the wavelength range of about 10 nm to 0.01 nm. It is to be noticed that these embodiments are not limited thereto and that slight variations in wavelength range may occur. Furthermore, for example lithography systems and methods using short wavelength radiation in the deep ultraviolet range and (far) below, typically electromagnetic radiation in the wavelength range of about 300 nm to 7 nm, also may benefit from certain embodiments. Where reflectivity or reflection coefficient of a component is used, reference is made to the fraction of incident radiation that is reflected by the component.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

In a first aspect, one embodiment relates to a sensor for sensing contamination in an application system. Such an application system may for example be a lithographic processing system, such as an EUV lithographic system, but not limited thereto. Advantageously, the sensor may be used in a system operating under vacuum. The sensor comprises a capping layer at the top of the sensor, whereon contamination can be formed or deposited. The sensor further may comprise a reflective substrate, whereby the capping layer may have the function of protecting the reflective substrate, although the embodiment is not limited thereto. Furthermore, the sensor may be adapted so as to cause a first reflectivity change upon initial formation of a first contamination layer on the capping layer when the sensor is provided in the system. Such an adaptation may be performed by adapting the capping layer, adapting, if present, a top layer of a reflective multi-layer in the reflective substrate, adapting, if present, a sub-layer positioned between the capping layer and the reflective substrate, or adapting any combination thereof. Such adapting may be performed by adapting a material selected for one or more of these layers, adapting a composition selected for one or more of these layers, adapting a structural features of one or more of these layers, adapting a refractive index (real part and/or imaginary part e.g. the absorption coefficient of one or more of these layers, or adapting a thickness of one or more of these layers. The first reflectivity change may be larger than an average reflectivity change upon formation of a thicker contamination layer on the capping layer. The latter expresses that during initial sensing, the change in reflectivity upon occurrence of a contamination layer is larger than the average change in reflectivity upon formation of a thicker contamination layer on the capping layer. The obtained sensor has the advantage of being highly sensitive to contamination, e.g. carbon contamination. The latter is based on the fact that the contamination measurements are based on optical measurements of the formed contamination layer in combination with the sensor, e.g. capping layer. The reflectivity of the substrate as function of the thickness of a contamination layer on top of a capping layer may be a superposition of a decreasing reflectivity function and an oscillating reflectivity function. The decreasing reflectivity function may be a monotonically decreasing function. It may be a quasi linear function. It may be an exponential function. The sensor thereby may be adapted so that the reflectivity change of the sensor upon initial formation of a first contamination on the capping layer when the sensor is in the system corresponds with a falling edge of the oscillating reflectivity function. Advantageously this corresponds with the steepest part of the falling edge of the reflectivity function. In certain embodiments, by measuring optical interference effects a high sensitivity for detecting contamination may be obtained. By way of illustration, the present invention not being limited thereto, an exemplary sensor 100 according to a first embodiment of the first aspect is shown in FIG. 1, indicating standard and optional components of the sensor.

The sensor 100 may comprise a reflective substrate 102. The reflective substrate may be a substrate that is reflective as such like a metallic substrate or it may be a substrate with a reflective coating. The latter may for example be a mirror, a mirror with coating, a substrate with reflective coating such as e.g. a substrate with a reflective multi-layer coating, etc. The reflectivity of the substrate may be for a wide range of wavelengths. It may be selected and/or optimized for the wavelength and/or the wavelength range used in the application or application system. In EUV applications, it may be for extreme ultraviolet radiation. In one example, as often used in EUV lithography, the reflective substrate 102 may comprise a substrate 104 covered with a reflective multi-layer coating 106. The substrate 104 then may be any type of substrate 104, e.g. a low thermal expansion substrate, onto which deposition of a reflective multi-layer coating 106 can be deposited. One example of a multi-layer coating 106 that can be used may be a multi-layer coating including alternating molybdenum and silicon layers (Mo—Si), typically around 40 layers each, with a total thickness of typically about 280 nm, the multi-layer not being limited thereto. The latter may be especially suitable as reflective substrates in EUV systems such as EUV lithographic systems.

The sensor 100 comprises a capping layer 108 on top of the reflective substrate. The capping layer 108 may protect the reflective substrate during making or using of the sensor. The capping layer 108 may be made of any suitable type of material, such as for example and not limited to silicon, ruthenium, titanium dioxide, rhodium, palladium, iridium, platinum, gold, silicon carbide, carbon, boron nitride, silicon nitride, titanium nitride. In some embodiments according to the present invention, the capping layer 108 may be made of a material that is not significantly subject to oxidation, i.e. that does not oxidize easily. Examples of such capping layers may be ruthenium, silver or gold capping layers.

The sensor 100 may additionally comprise an optional sub-layer 112 underneath the capping layer 108. The sub-layer 112 may minimize diffusion between the capping layer and the reflective substrate, e.g. the top layer of the reflective substrate. It may provide a better adhesion between the capping layer 108 and the reflective substrate 102. It may improve the overall reflectivity of the sensor. The sub-layer 112 may be made of any suitable type of material, such as, but not limited to, silicon, chrome, molybdenum, titanium, carbon, boron carbide or combinations thereof.

When the sensor 100 is used in an application system, it will allow detection of contamination of the application system, e.g. carbon contamination. The latter may be obtained by positioning the sensor 100 in an area where the contamination is to be sensed. Contamination of the application system then will lead to formation of a contamination layer 110 on top of the capping layer 108. Detection of the contamination layer 110 formation then will be possibly by optical measurement of the reflectivity of the sensor 100. The sensor 100 therefore may act as a witness sensor, undergoing the same contamination as the components, e.g. optical components, in the application system. From the change in reflectivity, an estimate of the contamination layer thickness can be obtained.

According to certain embodiments of the present invention, the sensor is adapted for causing, upon initial formation of a first contamination layer 110 on the capping layer when the sensor is first used for sensing, a change in reflectivity that is substantially larger than an average reflectivity change upon formation of a thicker contamination layer on the capping layer during further use. Likewise the change in reflectivity may be substantially larger than an average reflectivity change in the optics of the lithography tool, which may be optimized for maximum reflectivity, upon formation of an equal amount of contamination. The adaptation of the sensor may be adaptation of one or more of the capping layer, and if present, a sub-layer and or a top layer of a reflective multi-layer. The adaptation may be adaptation of the thickness of the layer, the material used, the composition used, the structure used, the refractive index and/or absorption coefficient used, etc.

Figure 2:
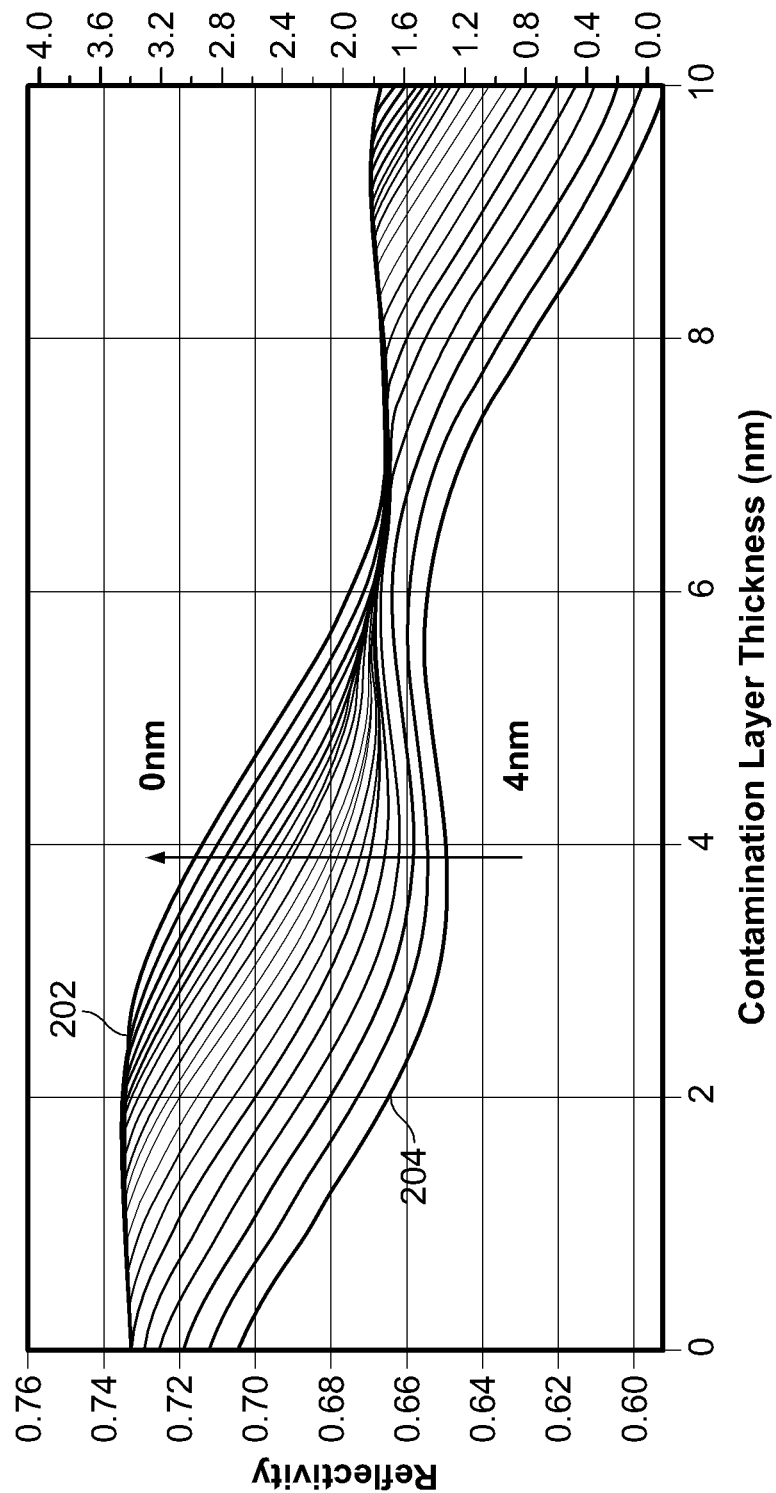
FIG. 2 illustrates the reflectivity for a sensor device according to an embodiment of the first aspect of the present invention as function of the contamination layer thickness and for different thicknesses of the capping layer.

By way of illustration, the present invention not being limited thereto, a schematic example of the reflectivity change depending on the thickness of the contamination layer is illustrated in FIG. 2. It can be seen that depending on the capping layer thickness, the effect of the initial contamination layer thickness on the reflectivity of the sensor will be that initially the reflectivity remains substantially the same or significantly drops. The thickness of the contamination is shown on the x-axis, the reflectivity of the sensor is shown on the y-axis, and the reflectivity curves are shown for a number of capping layer thicknesses, i.e. along arrow A the capping layer thickness varies from 4 nm to 0 nm in steps of 0.2 nm. For example, for one thickness of the capping layer, the reflectivity does not significantly change within the first couple of nanometer thickness of the contamination layer (also shown in FIG. 2 along curve 202). For other thicknesses of the capping layer the reflectivity changes up to a couple of percentages within the first couple of nanometer thickness of the contamination layer (also shown in FIG. 2 along curve 204). Certain embodiments of the present invention result in a high sensitivity to contamination by using a sensor adapted so that the sensor has a reflectivity curve wherein the initial contamination during sensing in the application system results in a significant change in reflectivity. As can be seen in FIG. 2, the reflectivity curve of the sensor as function of a thickness of a contamination layer on its capping layer is a superposition of a decreasing reflectivity function and an oscillating reflectivity function. The latter can e.g. also be seen by the fact that all points spaced from each other with a predetermined distance, which may be referred to as the period (related to the exposure wavelength and the refractive index), are substantially positioned on a single curve, which may be a linear or quasi-linear curve or which may be an exponential decreasing curve. The sensor according to certain embodiments of the present invention may be selected such that the reflectivity change of the sensor upon initial formation of a first contamination layer on the capping layer corresponds with a falling edge of the oscillating reflectivity function, more advantageously with a maximally falling edge. In other words, the parameters of the sensor may be selected such that the reflectivity at initial contamination has a significant reduction upon formation of the layer. The reflectivity change upon initial contamination of the sensor, e.g. upon the formation of the first about 1 nm or 2 nm of the contamination layer, may be at least about 0.5% reflectivity reduction per nanometer contamination layer thickness, advantageously at least about 1% reflectivity reduction per nanometer contamination layer thickness, more advantageously at least about 2% reflectivity reduction per nanometer contamination layer thickness. The initial reflectivity reduction may be selected as high as possible in order to have the largest sensitivity upon initial formation of the contamination layer thickness. In other words, for the example in FIG. 2, the capping layer thickness selected may be between about 2.8 nm and 4 nm.

In one embodiment, adaptation of the sensor 100 comprises adaptation of the capping layer 108. A number of parameters of the capping layer 108 may be adapted such as for example the material used for the capping layer 108, the composition of the capping layer 108, the structural properties of the capping layer 108, the refractive index of the capping layer 108, the absorption coefficient of the capping layer, the thickness of the capping layer 108, etc. Adaptation of the capping layer 108 may be combined with adaptation of other components of the sensor 100, e.g. with adaptation of the sub-layer 112 and/or with adaptation of the reflective multi-layer 106. The adaptation may be obtained from an optimization or a co-optimization of these parameters.

In one embodiment, the reflective substrate 102 of the sensor 100 may be adapted to the reflectivity behavior of the sensor 100 for contamination detection, and thus the sensitivity of the sensor 100. An improved reflectivity behavior or improved reflectivity curve in certain embodiments of the present invention may refer to a reflectivity curve wherein the sensitivity for contamination is high, i.e. where upon initial contamination when the sensor is used in the application system, the reflectivity changes more than the average reflectivity change for larger contamination layers. The reflective substrate may for example be adapted by replacing or modifying the material(s) used or by adapting the thickness of the materials used, adapting the composition of the materials used, adapting the structure of the materials used, adapting the refractive index of the materials used, adapting the absorption coefficient of the materials used, etc. For example, the reflective substrate may include a substrate with a reflective multi-layer coating, as is e.g. often used for mirrors used in EUV lithographic systems, whereby the reflective multi-layer coating then may be adapted to have an improved reflectivity curve for having a good sensitivity for sensing contamination. A number of different tuning possibilities may be exploited. The material at the surface of the reflective substrate may be selected accordingly. For example, in case a reflective multi-layer is used, the selection of which layer is at the top of the multi-layer, also often referred to as top layer of the reflective multi-layer, closest to the capping layer, can be altered or even another material may be used. Alternatively or in addition thereto, the thickness of the reflective substrate or part thereof may be tuned for optimizing the reflectivity curve, i.e. more specifically maximizing reflectivity. For example, in case a reflective multi-layer is used, the thickness of the layer closest to the capping layer may be tuned for having an optimal reflectivity curve. The latter will be illustrated in the examples provided. The top layer of the reflective substrate may be the capping layer of the sensor. The adaptation of the reflective substrate may be the sole adaptation of the sensor, or the latter may be performed in combination with the adaptation of the capping layer and/or with the adaptation of a sub-layer, if present between the capping layer and the multi-layer coating.

In one embodiment, a sub-layer of the sensor may be adapted to improve the reflectivity behavior of the sensor for sensing contamination, and thus the sensitivity of the sensor. An improved reflectivity behavior or improved reflectivity curve in certain embodiments may refer to a reflectivity curve wherein the sensitivity for contamination is high, i.e. where upon initial contamination when the sensor is used in the application system, the reflectivity changes more than the average reflectivity change for larger contamination layers. The sub-layer may for example be adapted by replacing or modifying the material(s) used or by adapting the thickness of the materials used, adapting the composition of the materials used, adapting the structure of the materials used, adapting the refractive index of the materials used, adapting the absorption coefficient of the materials used, etc. The adaptation of the sub-layer may be the sole adaptation of the sensor, or the latter may be performed in combination with the adaptation of the capping layer and/or with the adaptation of a sub-layer, if present between the capping layer and the multi-layer coating.

Figure 3:
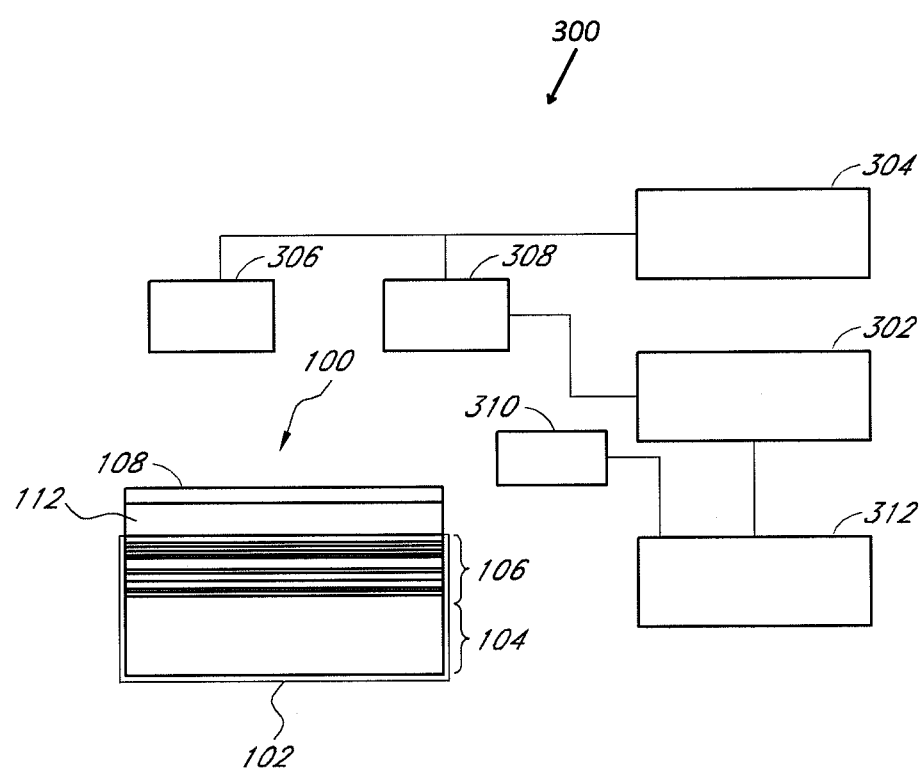
FIG. 3 illustrates a schematic representation of a detection system according to an exemplary embodiment of the second aspect of the present invention.

In a second aspect, the present invention relates to a detection system for detecting contamination in an application system. The detection system thereby may comprise a sensor as described in the first aspect and a processing system for deriving a contamination level as a function of a detected reflectivity of the sensor. By way of illustration, the present invention not being limited thereto, an example of a detection system is shown in FIG. 3, indicating standard and optional components of a detection system 300 according to an embodiment of the present invention. The detection system 300 comprises a sensor 100, comprising the features and advantages as set out in the first aspect, optionally comprising the same features and advantages as given in the corresponding particular embodiments and examples. The processing system 302 may be software and/or hardware based. The processing system 302 may be adapted to do the processing according to a predetermined algorithm, according to predetermined criteria or based on a neural network. The processing system 302 may be adapted to derive a thickness of a contamination layer, or an amount of contamination present derived there from. The latter may for example be based on a comparison of the change in reflectivity with a calibration curve or look-up table (LUT) previously determined or calculated for the sensor or for sensors with the parameters used. Evaluation of the reflectivity change may be based on measurement of the reflectivity of the sensor when the system is in use or used for a while. The processing system 302 furthermore may take into account the initial reflectivity of the sensor. The initial reflectivity of the sensor 100 may be predetermined for sensors with known parameters. Alternatively or in addition thereto, a measurement of the initial reflectivity also may be used.

The detection system 300 therefore may optionally comprise a control system 304 for controlling measurements of the reflectivity. These measurements may be performed using an internal or external irradiation source and internal or external reflectivity detector which may be controlled by the control system 304. The control system 304 may control the initial reflectivity measurement as well as the measurement of the reflectivity after or during contamination.

The detection system 300 furthermore may optionally comprise an irradiation source 306 for irradiating the sensor surface. This irradiation source may be used in common with the application system or may be separate thereto. The light sources used may be lasers, light emitting devices, etc. In one example, where the application system also is an optical system, the irradiation source advantageously provides radiation with the same wavelength or in the same wavelength range as the radiation used in the application system, in order to be able to better estimate the optical effect of the contamination on the different components of the application system. Alternatively, the reflectivity may be determined in another wavelength regime than used for the operation of the application system.

The detection system 300 also may comprise a reflectivity detector 308 for detecting the reflectivity of the sensor 100. Such a reflectivity detector is adapted to the wavelength or wavelength range generated with the irradiation source 306. The reflectivity detector 308 may be any type of detector fulfilling this requirement, such as for example a photodiode, CCD camera, etc. The control system 304 or controller may be coupled to the irradiation source and to the reflectivity detector 308 in any suitable way. The output of the reflectivity detector 308 may be provided to the processing system.

The detection system 300 also may comprise a contamination removal system 310. The contamination removal system 310 is adapted for performing a processing step which enables removal of the contamination, more specifically removal of the contamination layer formed on the sensor and possibly other optical components of the application system. The latter is advantageous as it increases the life time of the sensor 100. It allows re-use of the sensor after the contamination has been removed. Due to contamination of the sensor, the sensitivity of the sensor may be deteriorated, i.e. the reflectivity change of the sensor upon initial formation of a first contamination layer does not correspond anymore with the maximally falling edge of the oscillating reflectivity function. By removing the contamination using the contamination removal system 310, the sensor 100 may be optimized again, i.e. such that the reflectivity change of the sensor 100 upon initial formation of a first contamination layer 110, when the sensor 100 is in the application system, corresponds with the maximally falling edge of the oscillating reflectivity function. The removal system may be adapted for removing contamination in any suitable way, such as for example in a chemical or mechanical way. It may comprise an etching system for removing contamination by etching, a sputtering system for removing the contamination by sputtering, a scraper or scratching unit for mechanically removing contamination, etc.

The detection system 300 furthermore may comprise a feedback providing system 312, coupled to the processing system 302 and providing feedback regarding the contamination of the application system. The feedback providing system 312 may provide an indication when the contamination level is high or too high for the application system, i.e. according to predetermined criteria. It may provide input for an automatic adjustment of the system in order to deal with the contamination level, e.g. stopping the application in the application system, altering parameters of the application system, etc. The feedback providing system may be a hardware or software processing unit, adapted for providing feedback. It may comprise an information receiving unit, a calculation or processing unit for processing received information, a decision unit or selector for selectively provide an indication when the contamination level is high or too high for the application system, i.e. according to predetermined criteria, and/or an output unit for providing an input to the application system so as to control operation of the application system.

In a particular embodiment, the detection system 300 may be arranged to do subsequent, sequential, stepwise, semi-continuous or continuous measurements, whereby the level of contamination in the system is stepwise, semi-continuously or continuously monitored. In one embodiment, an automatic or automated detection of the contamination may be performed, optimizing the usability of the application system.

In a third aspect, the present invention relates to an application system using a sensor according to the first aspect as described above, or a detection system according to the second aspect as described above. Such an application system may be for example an extreme ultraviolet lithographic system, although the invention is not limited thereto. The application system may be any system wherein contamination may occur. It may for example be a vacuum system, as these systems already introduce less contamination. In one particular embodiment, the application system is an extreme ultraviolet lithographic system comprising a plurality of mirrors, whereby the contamination of the mirrors needs to be controlled in order to guarantee a sufficient quality of lithographic processing. The contamination then may stem, amongst others, from outgassing of the resist, which is a known problem in this field. The same features and advantages as described in the first and second aspect may be present in the application system. If the application system is an optical system or system using electromagnetic radiation, the irradiation source, and if present the detector of the application system may be used in the detection system. In other words, no separate irradiation source and detector then is required.

Figure 4:
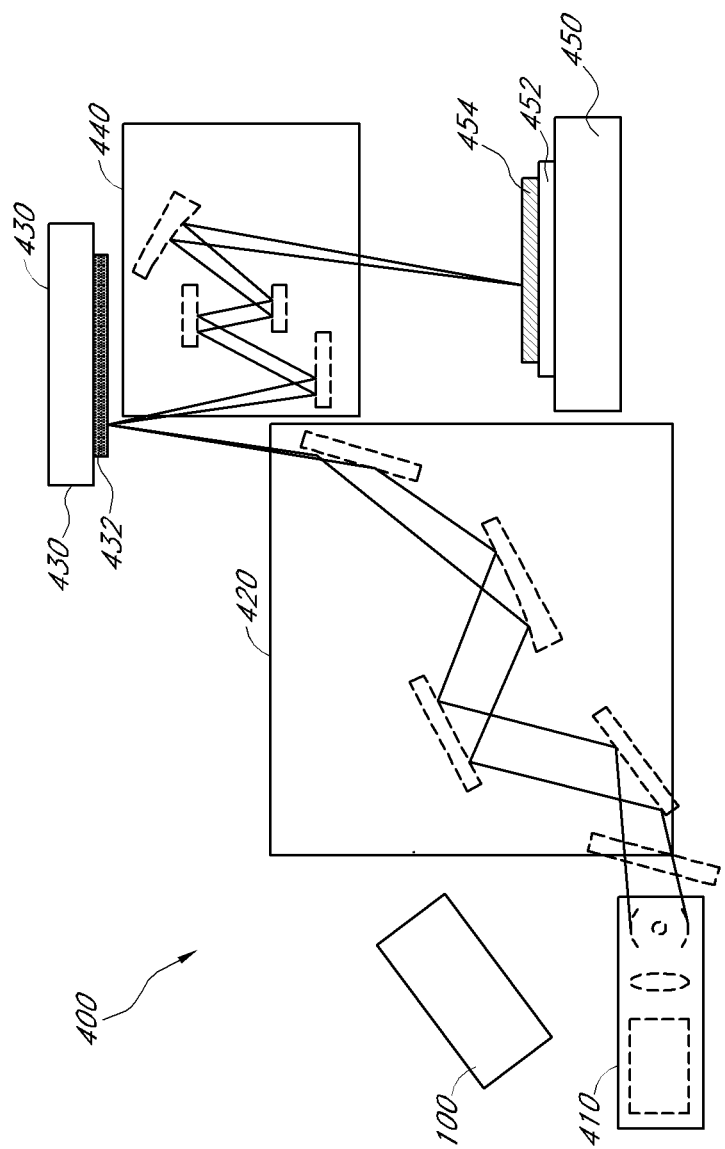
FIG. 4 illustrates a schematic representation of an EUV lithographic system as example of an application system according to an embodiment of the third aspect of the present invention.

In one particular application system, the application system is an extreme ultraviolet lithographic system comprising a plurality of mirrors for guiding the irradiation from the irradiation source over the reticle to the device to be lithographically processed, and where the resist layer is present. FIG. 4 shows a schematic view of such an example extreme ultraviolet lithography processing system. The system 400 comprises an illumination source 410, illumination optics 420 for guiding the illumination beam from the illumination source 410 to a reticle stage 430, the reticle stage 430 being adapted for holding a reticle 432. The system 400 furthermore comprises projection optics 440 for guiding the modulated illumination beam to the substrate stage 450 adapted for holding a device 452 typically comprising a resist layer 454. The illumination source 410 is adapted for providing electromagnetic radiation of a wavelength suitable for performing the lithographic processing, such as for example EUV light or X-ray radiation. The illumination optics may for example be a laser-fired plasma source, a discharge source, an undulator or wiggler in an electron beam storage ring or synchrotron, etc. The illumination optics 420 typically comprises one or more filters, mirrors, reflecting surfaces, adjusters, etc. in order to guide the illumination beam to the reticle stage 430. The illumination source 410 and illumination optics 420 typically are such that off-axis illumination of the reticle is obtained. Typically a lithographic system using short wavelengths according to certain embodiments of the present invention may operate in a reflective mode, i.e. wherein the optical elements typically are reflective elements rather than transmissive elements. The reticle stage 430 may be adapted for holding a reticle 432. Such a reticle is determined by a set of reticle parameters as described in more detail below. It typically comprises a reticle structure according to a reticle pattern used for modulating an illumination beam in order to generate a pattern in the resist layer 454 of the device 452. The projection optics 440 typically may comprise one or more filters, mirrors, reflecting surfaces, adjusters and possibly lenses. The components in the illumination optics 420 and the projection optics 440 may introduce typical aberrations in the optical systems, such as e.g. spherical aberrations, astigmatism, coma, etc. The reticle stage 430 and/or the substrate stage 450 may be adapted to provide movement to the reticle respectively the substrate. In certain embodiments of the present invention, a wafer stepper system as well as a step-and-scan system may be envisaged. At least one, some or all of the mirrors used in the extreme ultraviolet system 400 may comprise a capping layer. In contrast to the sensor device 100, the mirrors of the lithographic system may be such that they are adapted so as to cause a mirror reflectivity change upon initial formation of a contamination layer on the mirror that is substantially smaller than the average reflectivity change upon formation of a further contamination layer. In other words, the mirrors may be selected such that for small carbon thicknesses, e.g. smaller than about 2 nm or 3 nm, the change in reflectivity is small, preferably smaller than about 0.5%. Such mirrors therefore, at least during initial contamination formation, have a restricted sensitivity to contamination. The mirrors therefore may have a different, e.g. opposite, reflectivity change dependency compared to the sensor. An advantage of such an application system comprises that while the sensor used is highly sensitive for contamination and thus allows to accurately determine the contamination level already, this is not the case for the mirrors. Consequently the contamination advantageously can be detected well before the contamination affects the actual optics mirrors too strongly. Replacement or adjustment of components or system parameters of the application system thus may be performed well before the influence on the system is too large and has negative effects on the components of the system. A feedback providing system may be introduced to automatically indicate or adjust the system when a critical level is obtained.

In a fourth aspect, the present invention also relates to a method for sensing contamination in an application system. The method thereby comprises first providing a sensor with a capping layer. The sensor may comprise a reflective substrate which is positioned below the capping layer. The sensor further may comprise a sub-layer underneath the capping layer and on top of the reflective substrate. The method furthermore comprises sensing a first reflectivity change upon initial formation of a first contamination layer on the capping layer when the sensor is provided in the system. The sensor thereby is selected such that the first detected reflectivity change is larger than an average reflectivity change upon formation of a thicker contamination layer on the capping layer, allowing accurate and efficient determination of the contamination level. The sensor thereby may be selected as described in more detail in the first aspect. The sensor may be adapted by adapting the capping layer. Alternatively or in addition thereto, the top layer of the reflective multi-layer coating may be selected such that the first detected reflectivity change is larger than an average reflectivity change upon formation of a thicker contamination layer on the capping layer, allowing accurate and efficient determination of the contamination level. Alternatively or in addition thereto, a sub-layer underneath the capping layer may be selected such that the first detected reflectivity change is larger than an average reflectivity change upon formation of a thicker contamination layer on the capping layer, allowing accurate and efficient determination of the contamination level. Alternatively or in addition thereto the reflectivity change of the sensor may be such that it is faster than the reflectivity change of the actual optics in the system for the same contamination. An initial reflectivity of the sensor may be obtained, e.g. by receiving such information regarding the sensor or by measuring the initial reflectivity of the sensor. Optionally, the method comprises, based on the sensed first reflectivity change, determining a contamination quantity. The latter may be obtained by deriving a thickness of a contamination layer from the measured reflectivity change. A predetermined reflectivity curve as function of contamination of the sensor surface may be used to determine the thickness. Such predetermined reflectivity curve may be either obtained as input and be determined on a test sensor or may be calculated. Based on the determined contamination quantity, the method further may comprise controlling the application system and adjusting the application system, e.g. by halting, by adjusting system parameters, etc.

In a fifth aspect, the present invention relates to a method for manufacturing a sensor for sensing contamination in an application system. The manufacturing may comprise obtaining a substrate. The latter may either be obtaining a substrate such as for example a reflective substrate externally or providing the substrate. Such a substrate, e.g. reflective substrate, may be made by any suitable manufacturing technique, such as for example physical or chemical deposition techniques, semiconductor processing techniques, etc. The method furthermore comprises depositing a capping layer on the substrate thus forming a sensor, wherein the sensor is adapted so as to cause a first reflectivity change upon initial formation of a first contamination layer on the capping layer when the sensor is provided in the system that is larger than an average reflectivity change upon formation of a thicker contamination layer on the capping layer. Deposition of a capping layer may comprise any form of deposition, such as for example physical or chemical deposition techniques, atomic layer deposition, physical vapor deposition, sputtering, chemical vapor deposition, etc.

Another inventive aspect relates to a device made using the manufacturing technique as described in the present aspect.

Figure 5:
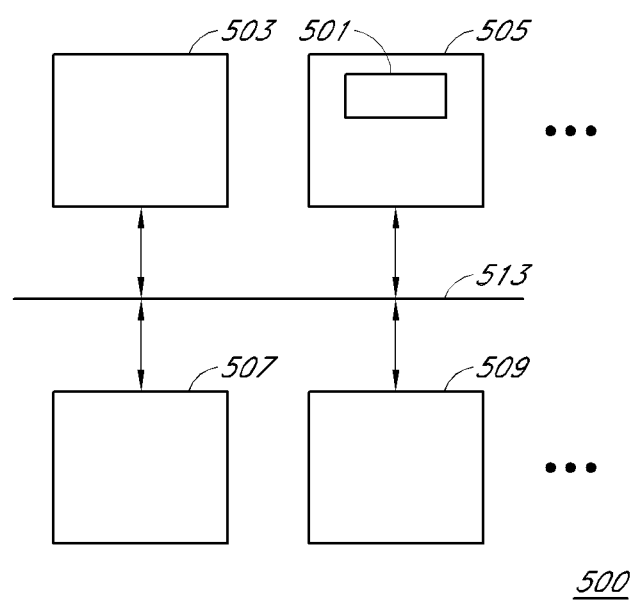
FIG. 5 shows a processing unit as can be used for performing a method of sensing according to one embodiment of an aspect of the present invention.

In further aspect, the present invention also relates to a computer program product for performing a method for sensing when the computer program product is executed on a processing system such as a computer. Furthermore, the above-described method embodiments may be implemented in a processing system 500 such as shown in FIG. 5. FIG. 5 shows one configuration of processing system 500 that includes at least one programmable processor 503 coupled to a memory subsystem 505 that includes at least one form of memory, e.g., RAM, ROM, and so forth. It is to be noted that the processor 503 or processors may be a general purpose, or a special purpose processor, and may be for inclusion in a device, e.g., a chip that has other components that perform other functions. Thus, one or more aspects of the present invention can be implemented in digital electronic circuitry, or in computer hardware, firmware, software, or in combinations of them. The processing system may include a storage subsystem 507 that has at least one disk drive and/or CD-ROM drive and/or DVD drive. In some implementations, a display system, a keyboard, and a pointing device may be included as part of a user interface subsystem 509 to provide for a user to manually input information. Ports for inputting and outputting data also may be included. More elements such as network connections, interfaces to various devices, and so forth, may be included, but are not illustrated in FIG. 5. The various elements of the processing system 500 may be coupled in various ways, including via a bus subsystem 513 shown in FIG. 5 for simplicity as a single bus, but will be understood to those in the art to include a system of at least one bus. The memory of the memory subsystem 505 may at some time hold part or all (in either case shown as 511) of a set of instructions that when executed on the processing system 500 implement the method embodiments described herein. Thus, while a processing system 500 such as shown in FIG. 5 is prior art, a system that includes the instructions to implement aspects of the methods for sensing contamination is not prior art, and therefore FIG. 5 is not labeled as prior art.

Another inventive aspect relates to a computer program product which provides the functionality of any of the methods as described herein when executed on a computing device. Such computer program product can be tangibly embodied in a carrier medium carrying machine-readable code for execution by a programmable processor. Another inventive aspect relates to a carrier medium carrying a computer program product that, when executed on computing means, provides instructions for executing any of the methods as described above. The term "carrier medium" refers to any medium that participates in providing instructions to a processor for execution. Such a medium may take many forms, including but not limited to, non-volatile media, and transmission media. Non volatile media includes, for example, optical or magnetic disks, such as a storage device which is part of mass storage. Common forms of computer readable media include, a CD-ROM, a DVD, a flexible disk or floppy disk, a tape, a memory chip or cartridge or any other medium from which a computer can read. Various forms of computer readable media may be involved in carrying one or more sequences of one or more instructions to a processor for execution. The computer program product can also be transmitted via a carrier wave in a network, such as a LAN, a WAN or the Internet. Transmission media can take the form of acoustic or light waves, such as those generated during radio wave and infrared data communications. Transmission media include coaxial cables, copper wire and fiber optics, including the wires that comprise a bus within a computer.

By way of illustration, the present invention not being limited thereto, a number of examples are provided, indicating some of the features and/or advantages of certain embodiments.

Figure 6A:
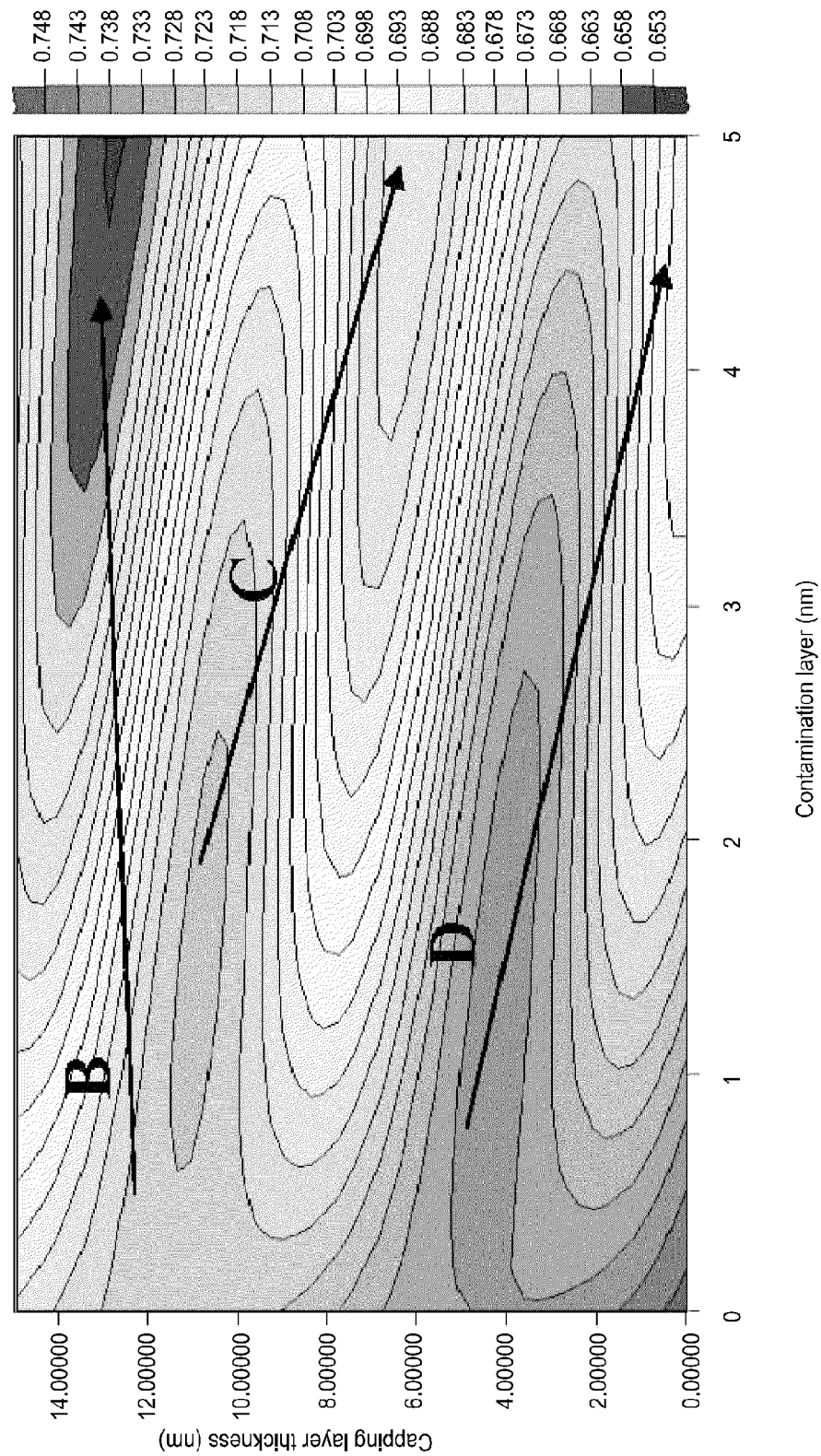
Figure 6B:
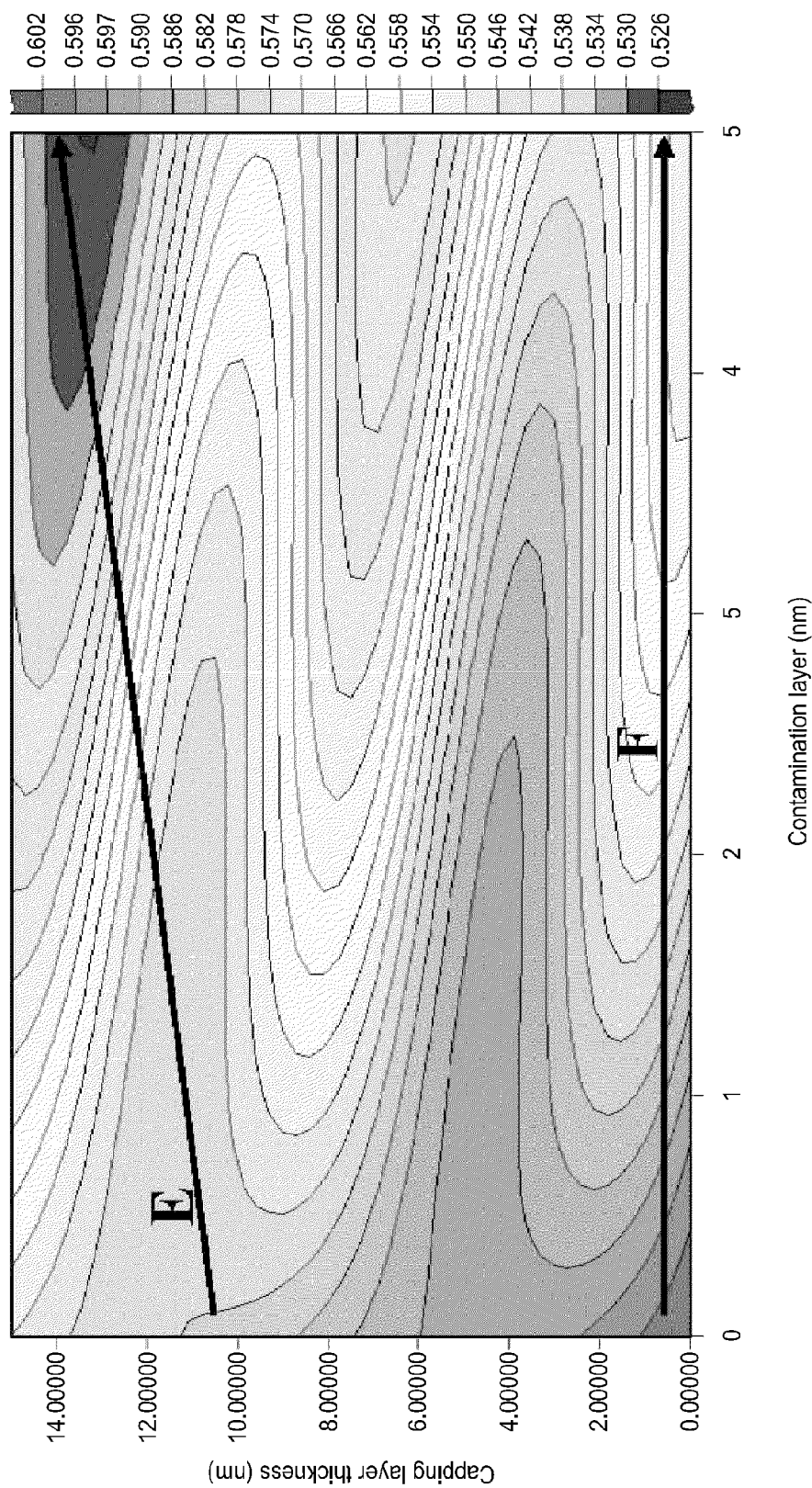
Figure 6C:
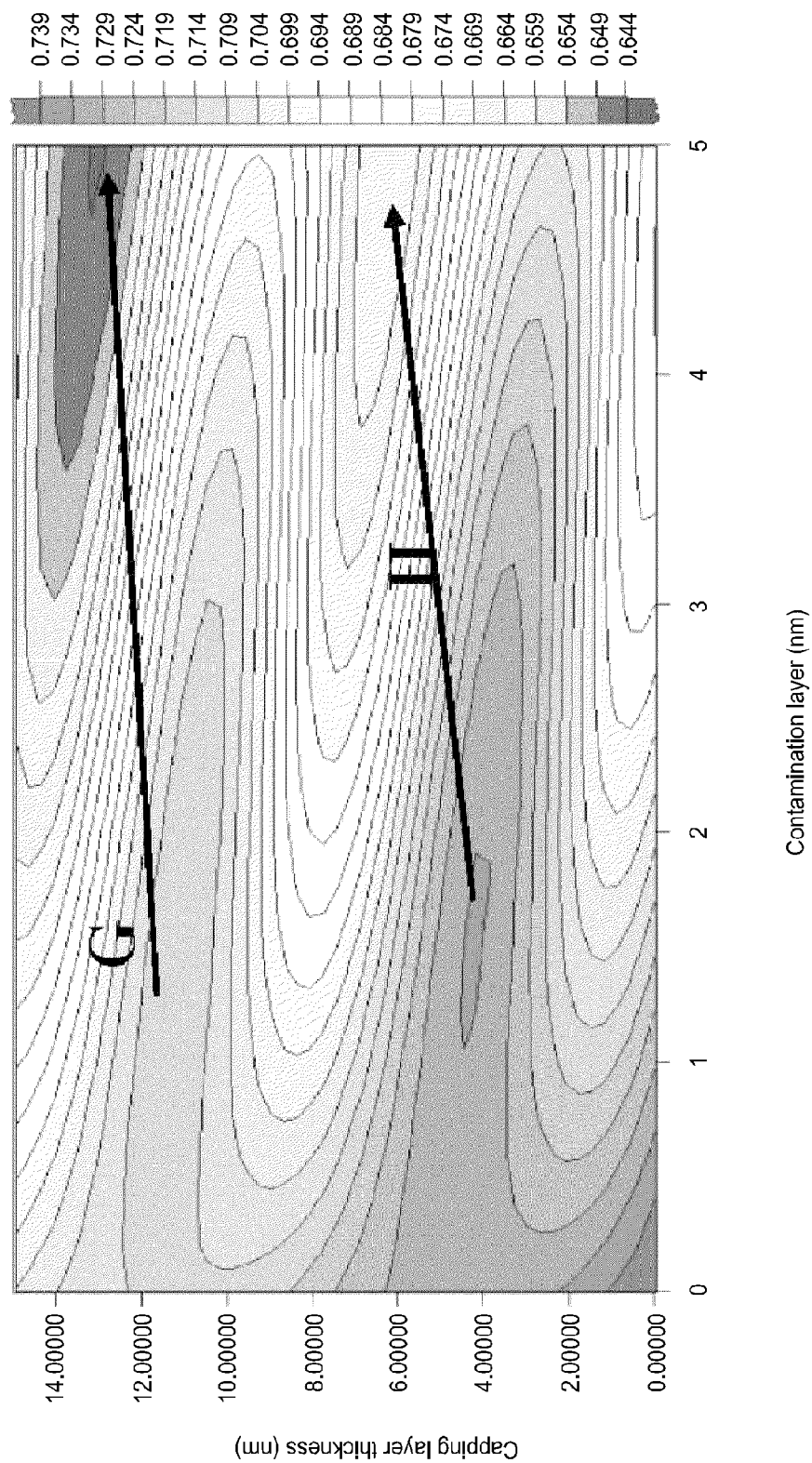

In a first example, a topological representation of the reflectivity of a reflective substrate with multi-layer coating is shown for different thicknesses of the contamination present on the capping layer and for different capping layer thicknesses. FIG. 6*a* to FIG. 6*b* give representations of the reflectivity for different structures of the multi-layer coating or different wavelengths used. FIG. 6a illustrates the reflectivity for a reflective substrate comprising 40 alternating layers of molybdenum and silicon (Mo—Si) with the molybdenum thickness 2.9 nm, the silicon thickness 4 nm, the wavelength used for reflectivity being 13.4 nm and the capping layer being the last layer of silicon, i.e. the Si top layer of the multi-layer substrate. The reflectivity along arrow B varies from approximately 71% to approximately 65% in steps of 0.5%. The reflectivity along arrow C varies from approximately 72.5% to approximately 66% in steps of 0.5%. The reflectivity along arrow D varies from approximately 74% to approximately 68% in steps of 0.5%. FIG. 6b illustrates a similar structure wherein the molybdenum layer thickness is 3 nm and the wavelength used for measuring the reflectivity is 13.6 nm. The reflectivity along arrow G varies from approximately 71.6% to approximately 64.6% in steps of 0.5%. The reflectivity along arrow H varies from approximately 73.6% to approximately 66.1% in steps of 0.5%. FIG. 6c illustrates the results for the same structure as in FIG. 6b, but whereby the radiation used for measuring the reflectivity has a relative broad peak with a 0.5 nm full width at half maximum. The reflectivity along arrow E varies from approximately 58% to approximately 52.8% in steps of 0.4%. The reflectivity along arrow F varies from approximately 60% to approximately 55% in steps of 0.4%. Furthermore FIG. 6d illustrate the same structure as in FIG. 6b, but wherein the upper silicon layer used as capping layer is reduced with 2.5 nm by the mask process, as indicated with arrow 602. The reflectivity along arrow I varies from approximately 71.7% to approximately 65.2% in steps of 0.5%. The reflectivity along arrow J varies from approximately 73.2% to approximately 68.2% in steps of 0.5%. It can be seen in FIG. 6c and FIG. 6d that there are a number of capping layer thicknesses (in this example the capping layer being equal to the Si top layer of the reflective multi-layer substrate) that result in a small sensitivity whereas there are also a number of capping layer thicknesses that result in a large sensitivity to contamination, in the present example being carbon contamination. These examples illustrate that fine tuning of the capping layer and also of the top layer of the reflective substrate can allow to minimize or to maximize the sensitivity to contamination.

Figure 7A:
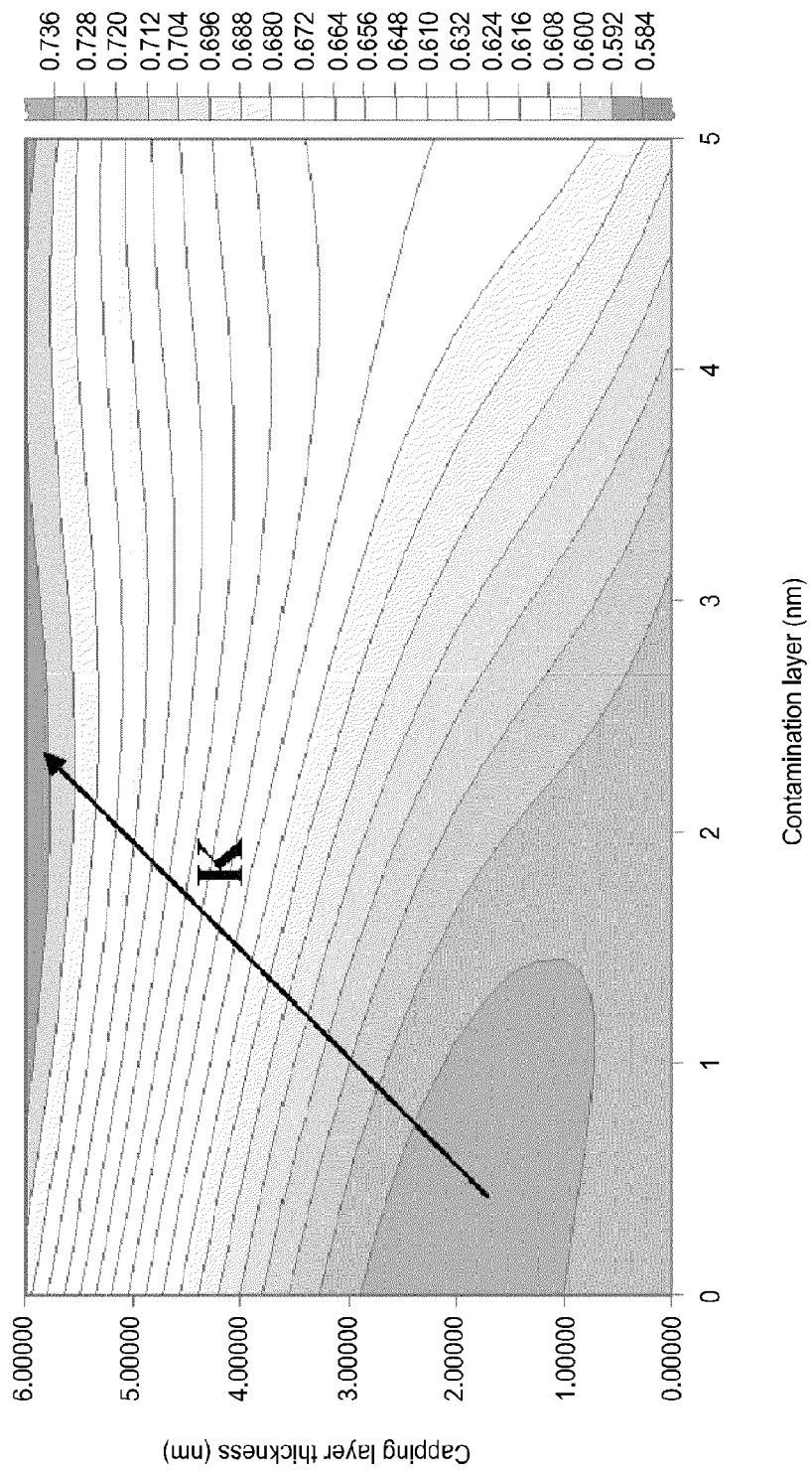
FIG. 7a to FIG. 7c illustrate the effect of the capping layer thickness on a top layer used in a multi-layer coating of a reflective substrate on the sensitivity of the reflectivity to deposition/formation of a contamination layer, illustrating principles that can be used in certain embodiments.
Figure 7B:
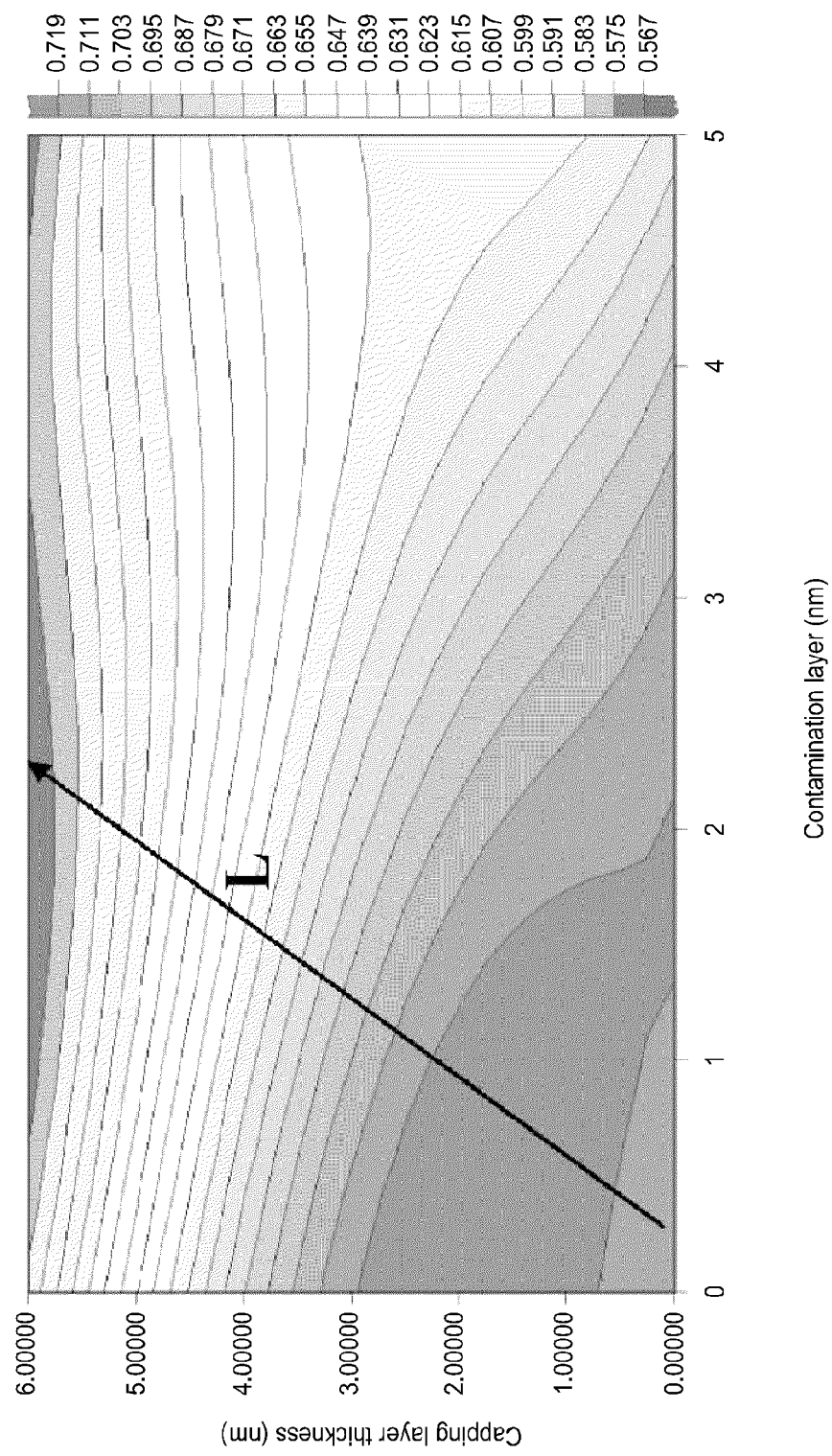
Figure 7C:
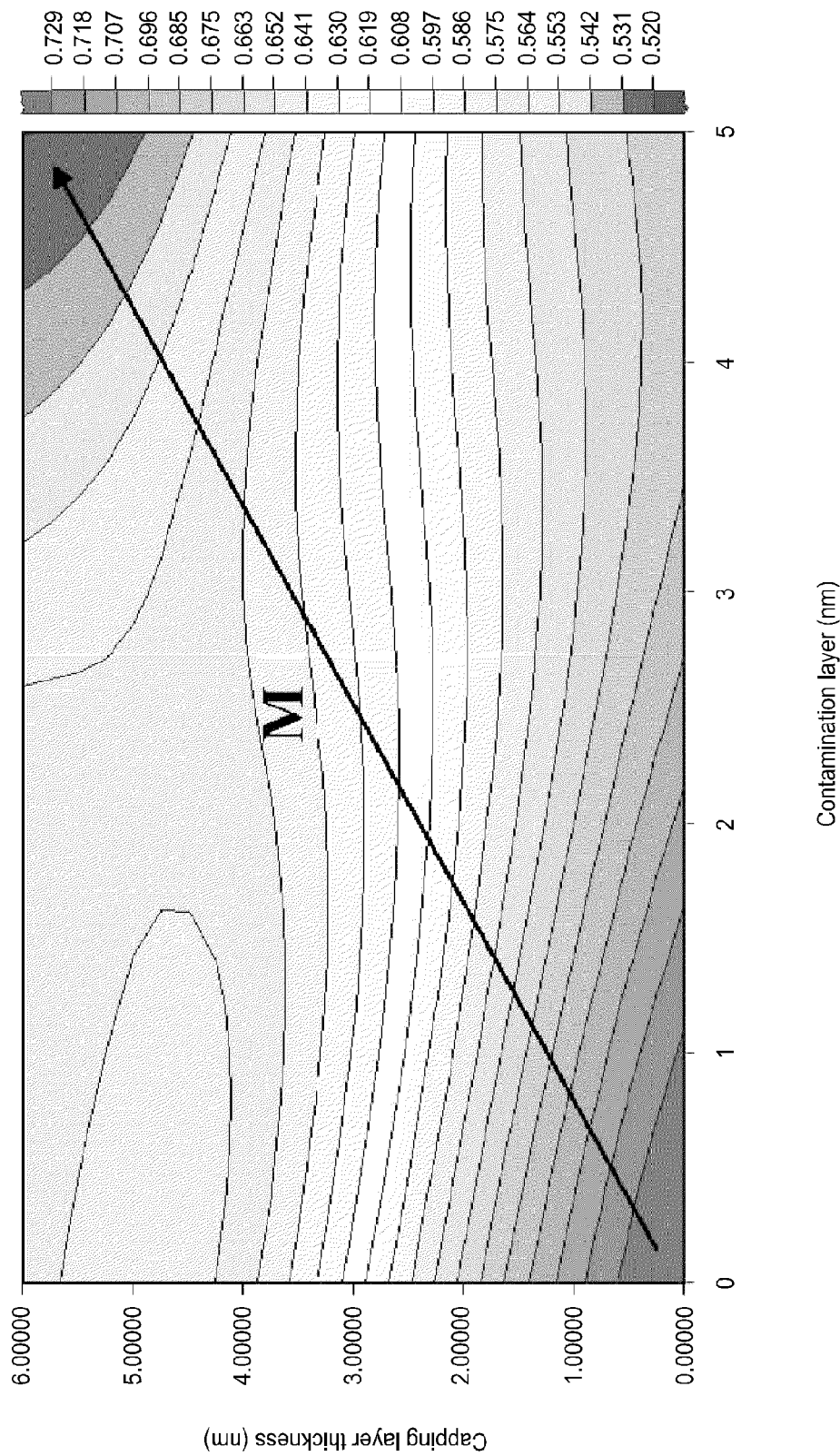

In a second example, a topological representation as in the first example is provided, wherein the capping layer used is ruthenium instead of silicon. FIG. 7 illustrates the situation for a 40 layer molybdenum and silicon multi-layer stack whereby the thickness of the molybdenum is 3 nm, the thickness of the silicon is 4 nm and the wavelength used for measuring reflectivity is 13.6 nm. In FIG. 7a, the ruthenium capping layer is deposited on top of a standard silicon layer (4 nm thickness), the silicon layer being the top layer of the multi-layer stack. The reflectivity along arrow K varies from approximately 73.2% to approximately 58.8% in steps of 0.8%. In FIG. 7b, the ruthenium capping layer is deposited on top of a thick silicon top layer. The reflectivity along arrow L varies from approximately 72.3% to approximately 57.1% in steps of 0.8%. In FIG. 7c, the ruthenium capping layer is deposited on top of a standard molybdenum layer (3 nm thickness), the molybdenum layer being the top layer of the multi-layer stack. The reflectivity along arrow M varies from approximately 72.3% to approximately 52.6% in steps of 0.11%. The latter illustrates that by tuning the materials and the thicknesses of the top layer of the reflective substrate and the capping layer, tuning of the sensitivity to contamination of the sensor can be obtained.

Figure 8A:
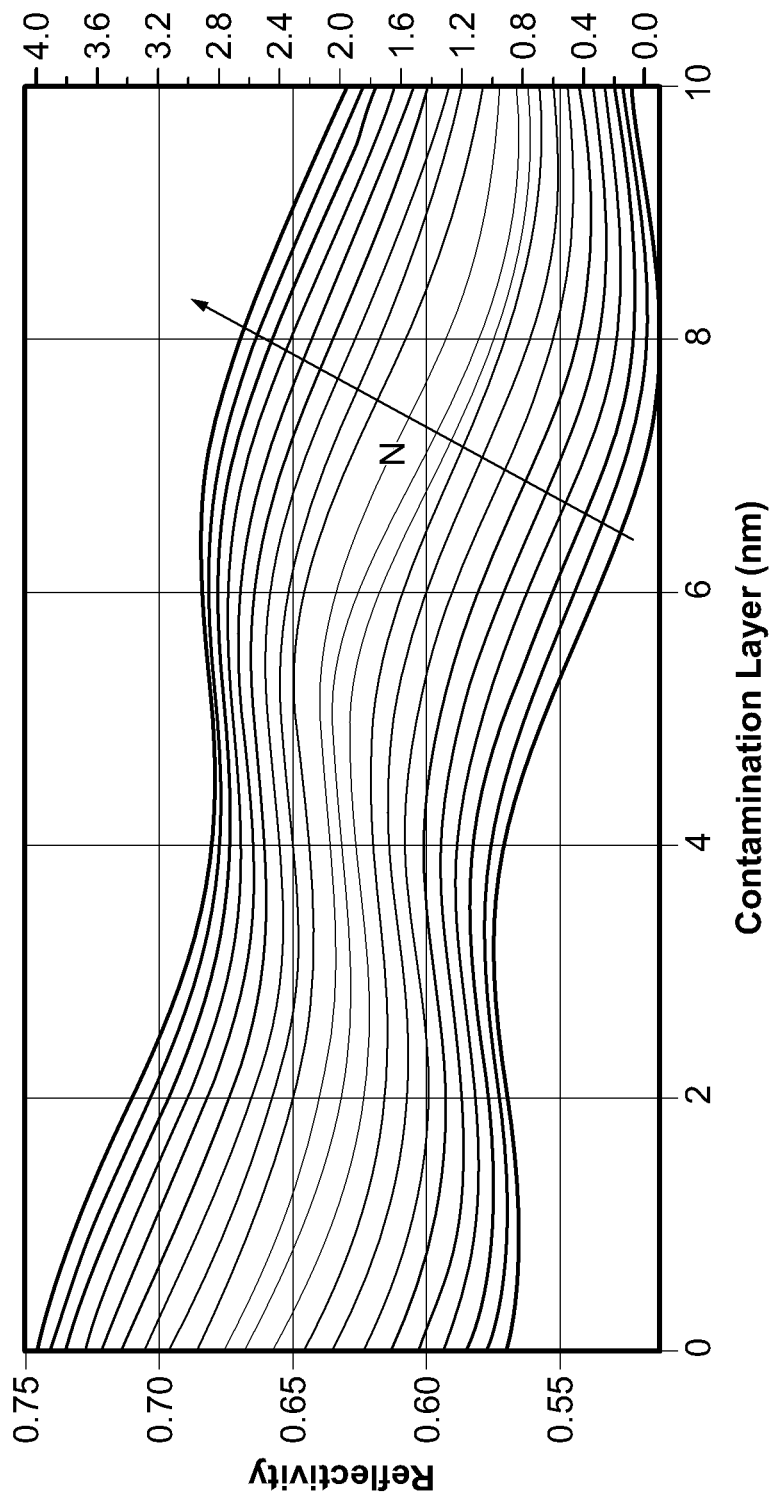
FIG. 8a to FIG. 8d illustrate the effect of the top layer and its thickness used in a multi-layer coating of a reflective substrate on the sensitivity of the reflectivity to deposition/ formation of a contamination layer, illustrating principles that can be used in certain embodiments.
Figure 8B:
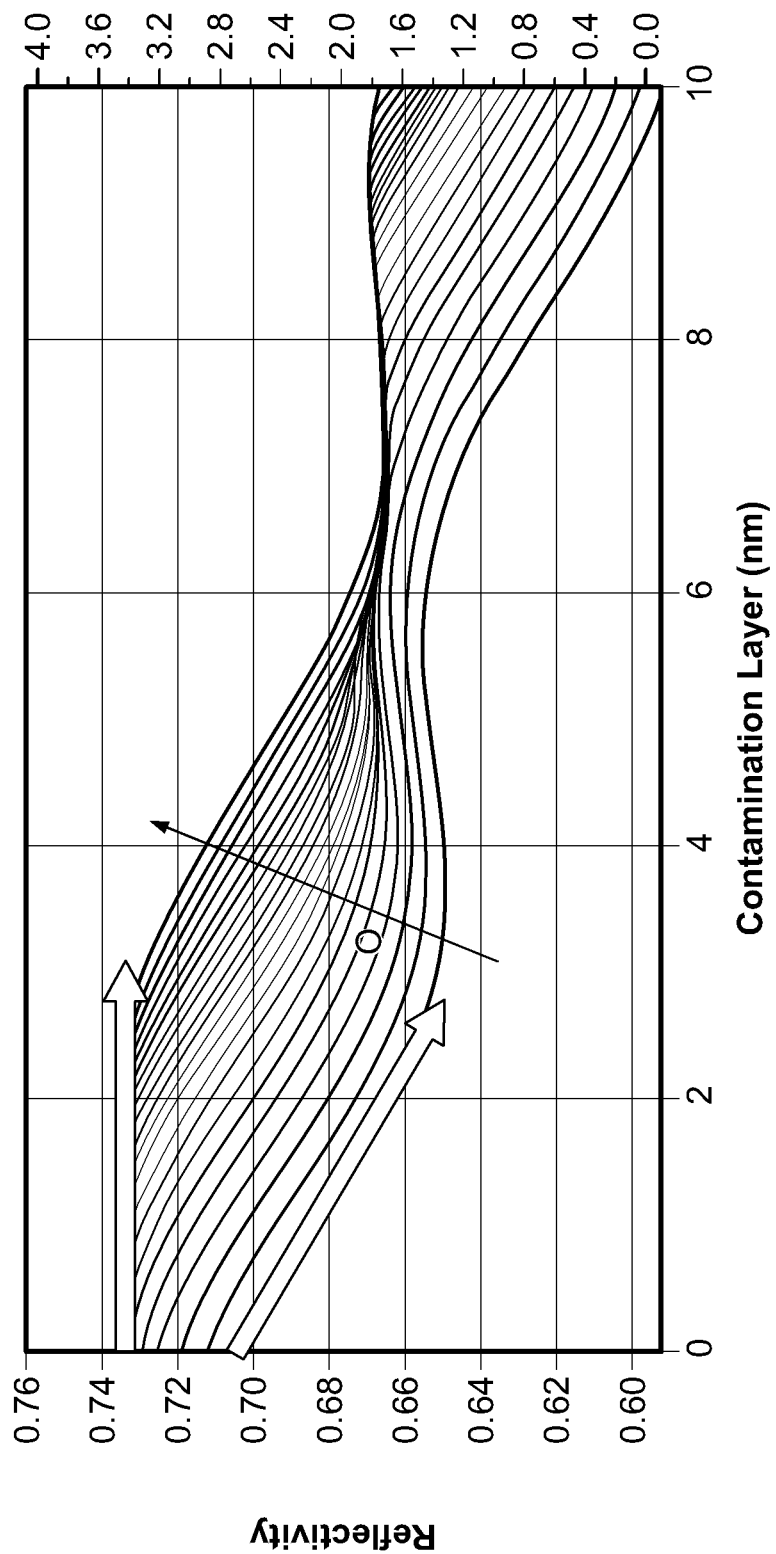

In a third example, the reflectivity of the sensor is shown as function of a contamination layer on top of the capping layer, for a number of different capping layer thicknesses. The latter illustrates that tuning of the capping layer already allows to make the reflectivity of the sensor less or more dependent on the amount of contamination on top of the capping layer. FIG. 8a illustrates the reflectivity for a multi-layer as described in the second example, wherein the ruthenium is deposited on top of a molybdenum layer. The thickness of the ruthenium capping layer varies along arrow N from approximately 4 nm to approximately 0 nm in steps of 0.2 nm. It can be seen that for a thickness of 3 nm ruthenium capping layer, the control of reflectivity loss can be within 1% up to a contamination thickness, in the present example being carbon contamination, of 5 nm. A high contamination dependency can be seen for small thicknesses of the capping layer, e.g. for a thickness of about 0.5 nm. The selection between either having molybdenum at the top of the reflective substrate as shown in the present example, or silicon at the top of the reflective substrate as shown in the second example is a trade off between reflectivity and carbon sensitivity. The latter is also illustrated in FIG. 8b illustrating results for the same structure but whereby the ruthenium layer is deposited on a silicon layer of 4 nm thick. The sensitivity of the reflectivity to contamination can be increased to about 5% reflectivity loss for a contamination layer thickness of 3 nm, whereas without ruthenium capping layer the reflectivity loss is reduced to 0.5% for a contamination layer thickness of 3 nm, as illustrated in FIG. 8b. The thickness of the capping layer varies along arrow O from approximately 4 nm to approximately 0 nm in steps of 0.2 nm.

Figure 8C:
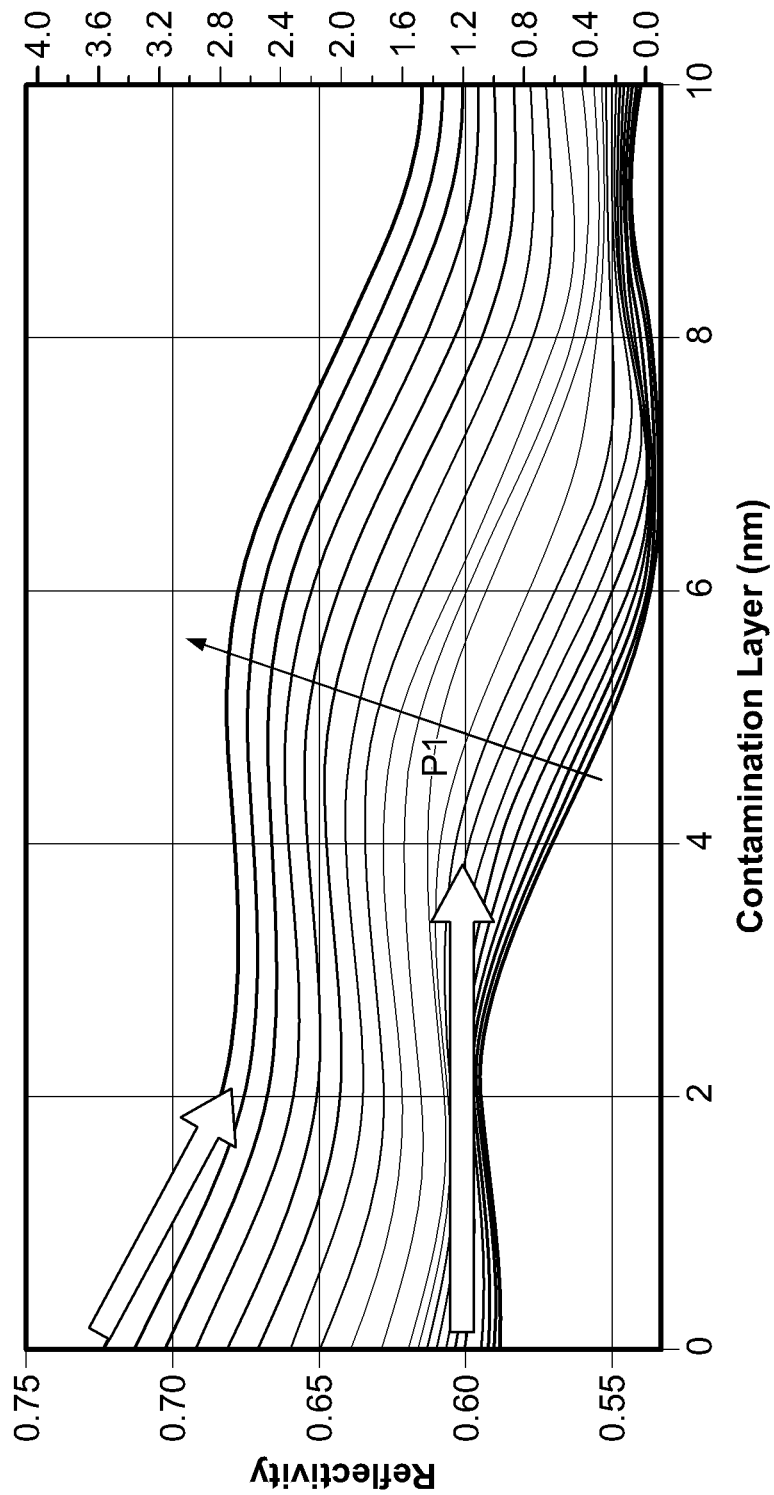
Figure 8D:
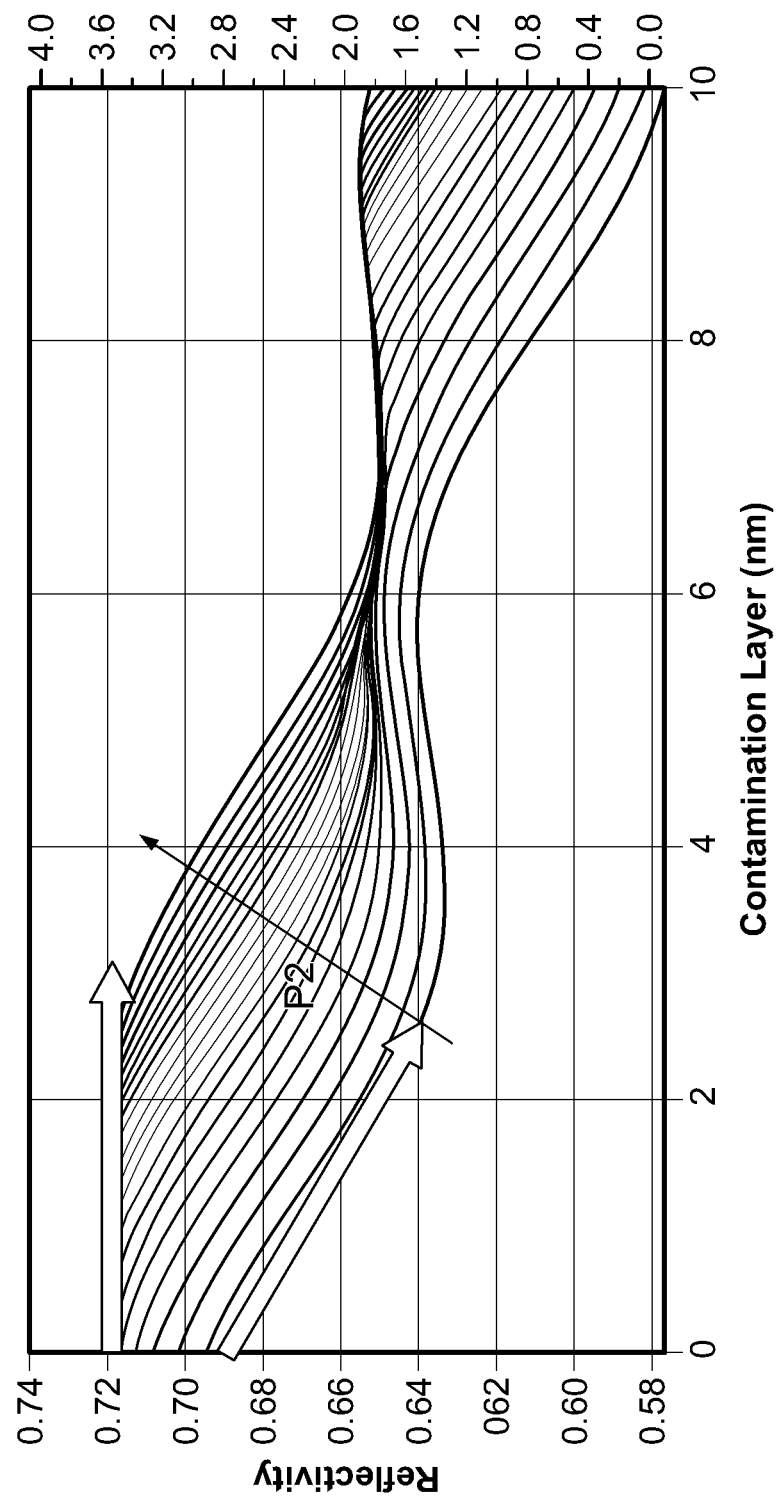

In a fourth example, the reflectivity of the sensor is shown as function of a contamination layer on top of the capping layer. The example illustrates the effect of top layer thickness variation for a silicon top layer and a ruthenium layer as capping layer. The latter is illustrated in FIG. 8b, and further in FIG. 8c and FIG. 8d, indicating respectively a reflective substrate with an upper silicon layer of 4 nm, 8 nm and 11 nm. Variation of the thickness of the capping layer along arrow P1 and P2 from approximately 4 nm to approximately 0 nm in steps of 0.2 nm is indicated. It can be seen that tuning the thickness of a layer in the reflective substrate can be used for adjusting the sensitivity to contamination. In the present example, it can be seen that for a thickness of 8 nm, the reflectivity loss is substantially higher for initial contamination than for 4 nm or 11 nm.

Figure 9A:
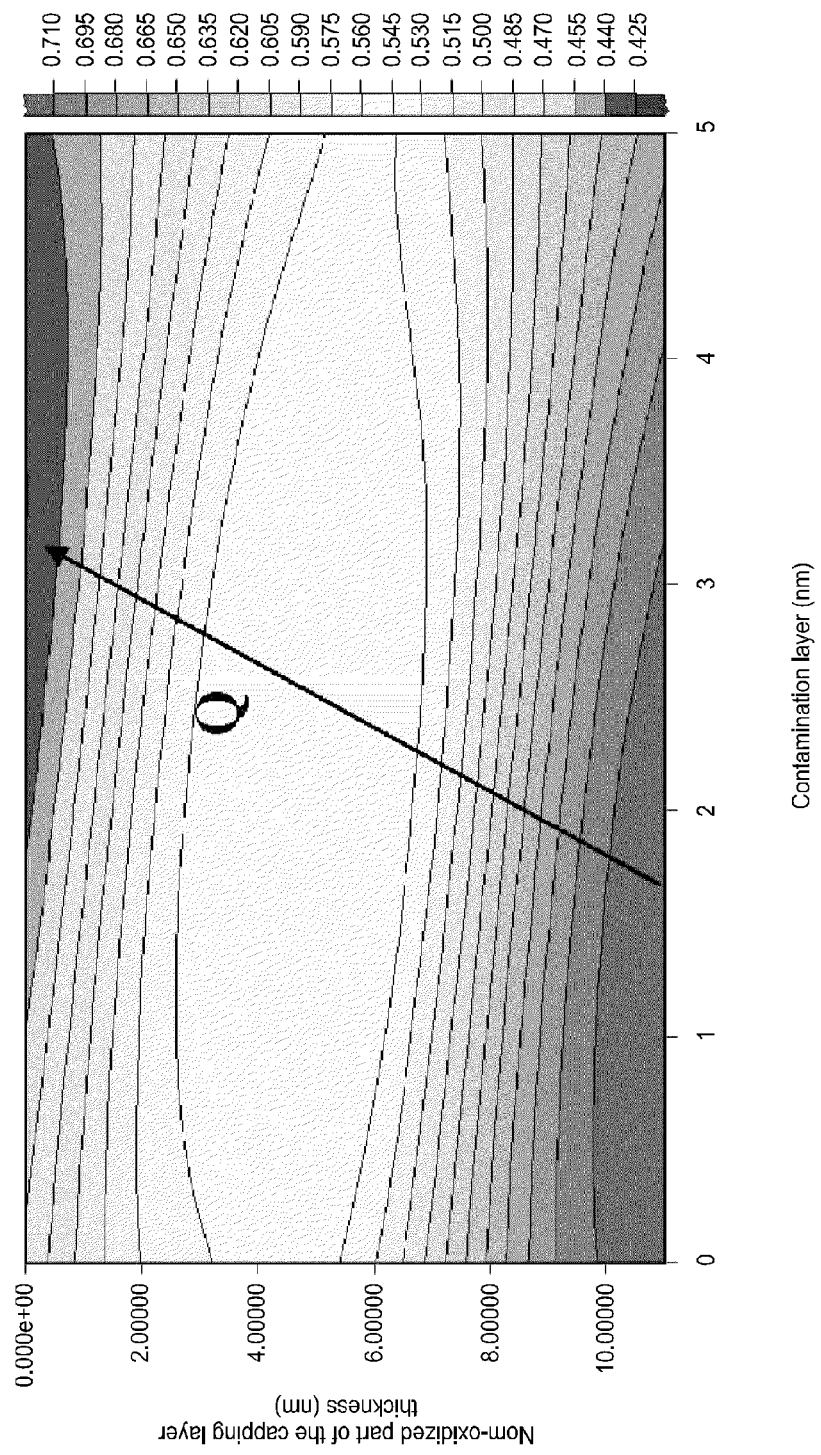
FIG. 9a to FIG. 10b illustrate the effect of oxidation of the capping layer on the sensitivity of the reflectivity to deposition/formation of a contamination layer, illustrating principles that can be used in certain embodiments.
Figure 9B:
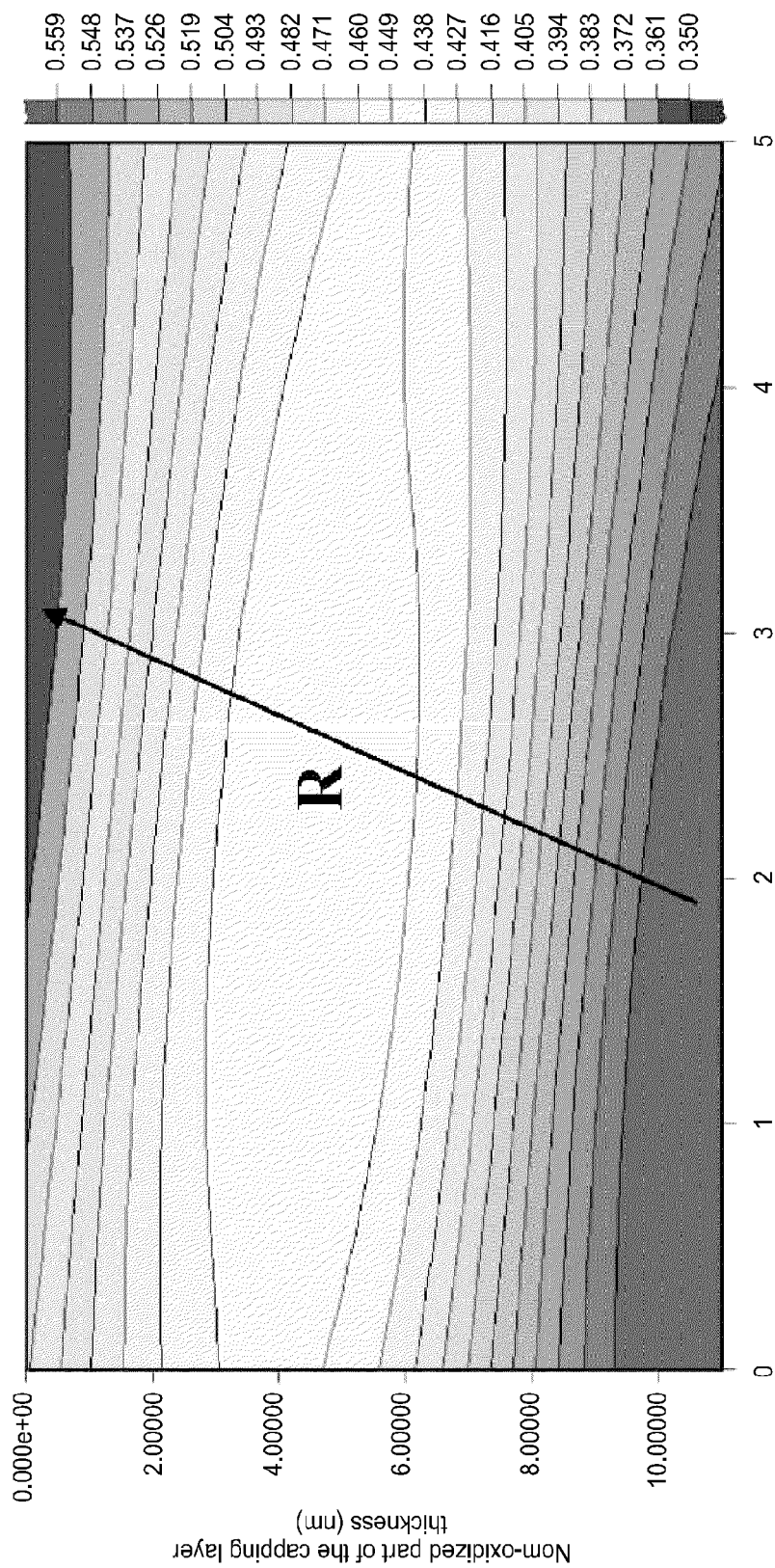
Figure 9C:
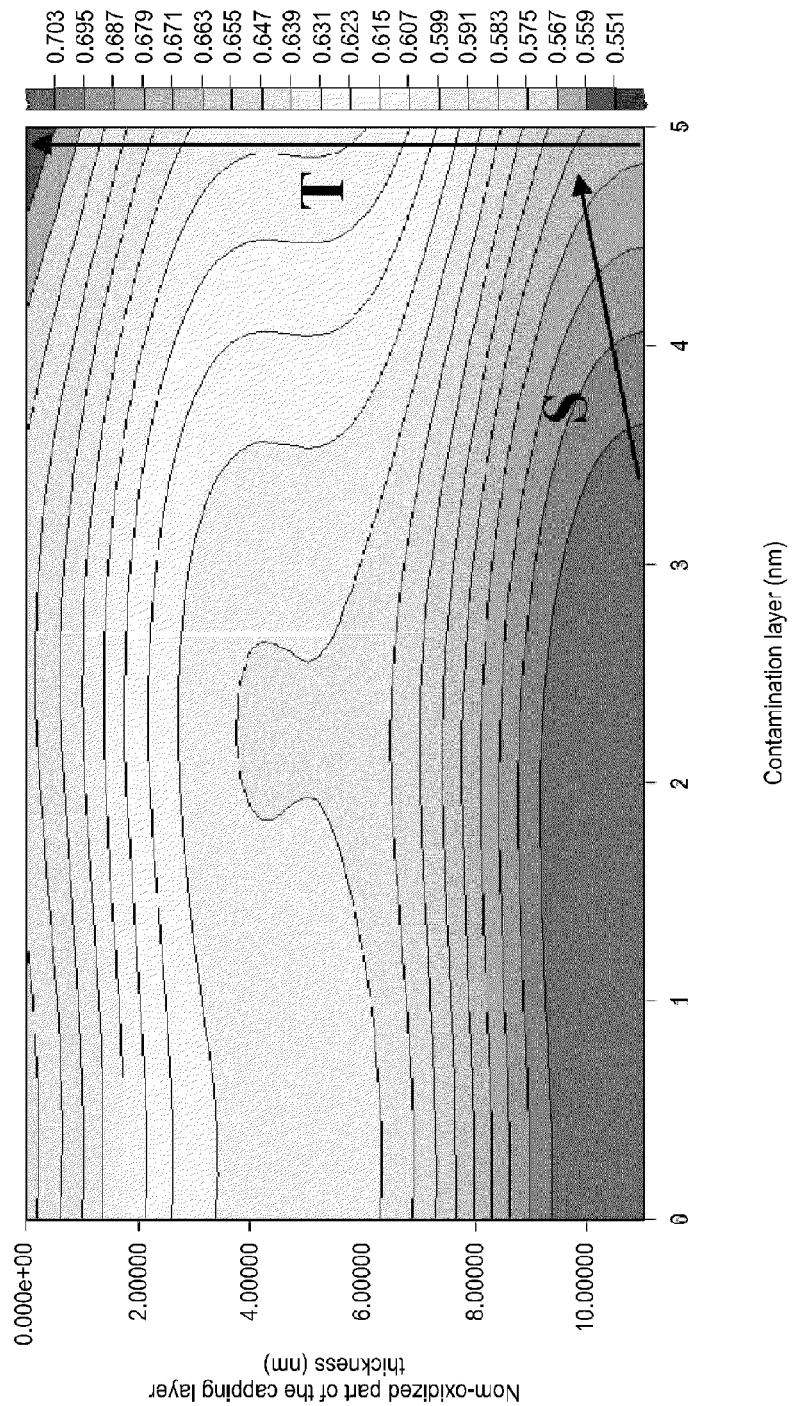

In a fifth embodiment, as illustrated in FIG. 9a to FIG. 9c, the additional effect of oxidation of the capping layer on the reflectivity and its sensitivity to contamination is illustrated. FIG. 9a illustrates the reflection properties of a sensor having a reflective multi-layer sensor, wherein the top layer is a silicon dioxide $SiO_2$ layer on top of a silicon capping layer. In the present figure the assumption is made that the silicon dioxide layer therein has about twice the thickness of the silicon that it replaces in the capping layer. The structure studied is a reflective substrate comprising a forty layer multi-layer of alternating molybdenum layers (3 nm thickness) and silicon layers (4 nm thickness), ending with an 11 nm thick silicon capping layer. The reflectivity is measured for a wavelength of 13.6 nm. Whereas the reflectivity is significantly reduced due to the oxidation, the influence on the sensitivity for contamination detection is relatively small. The reflectivity along arrow Q varies from approximately 70.7% to approximately 43.7% in steps of 2.5%. In FIG. 9b the reflectivity is shown for the same structure, whereby a broader irradiation wavelength is used (13.6 nm with 0.5 nm FWHM). The reflectivity along arrow R varies from approximately 70.2% to approximately 43.2% in steps of 1.5%. In FIG. 9C illustrates the reflectivity of the sensor as described in FIG.

9a, but wherein the thickness of the silicon dioxide layer is equal to the thickness of the silicon that it replaces in the capping layer. It can be seen that the reflectivity then becomes substantially sensitive for contamination from a contamination layer thickness of about 3 nm. The reflectivity along arrow S varies from approximately 69.9% to approximately 67.5% in steps of 0.8% and along arrow T from 67.5% to 55.5%. It can be seen that the oxidation causes a reflectivity loss but that the contamination layer thickness matters relatively little.

Figure 10A:
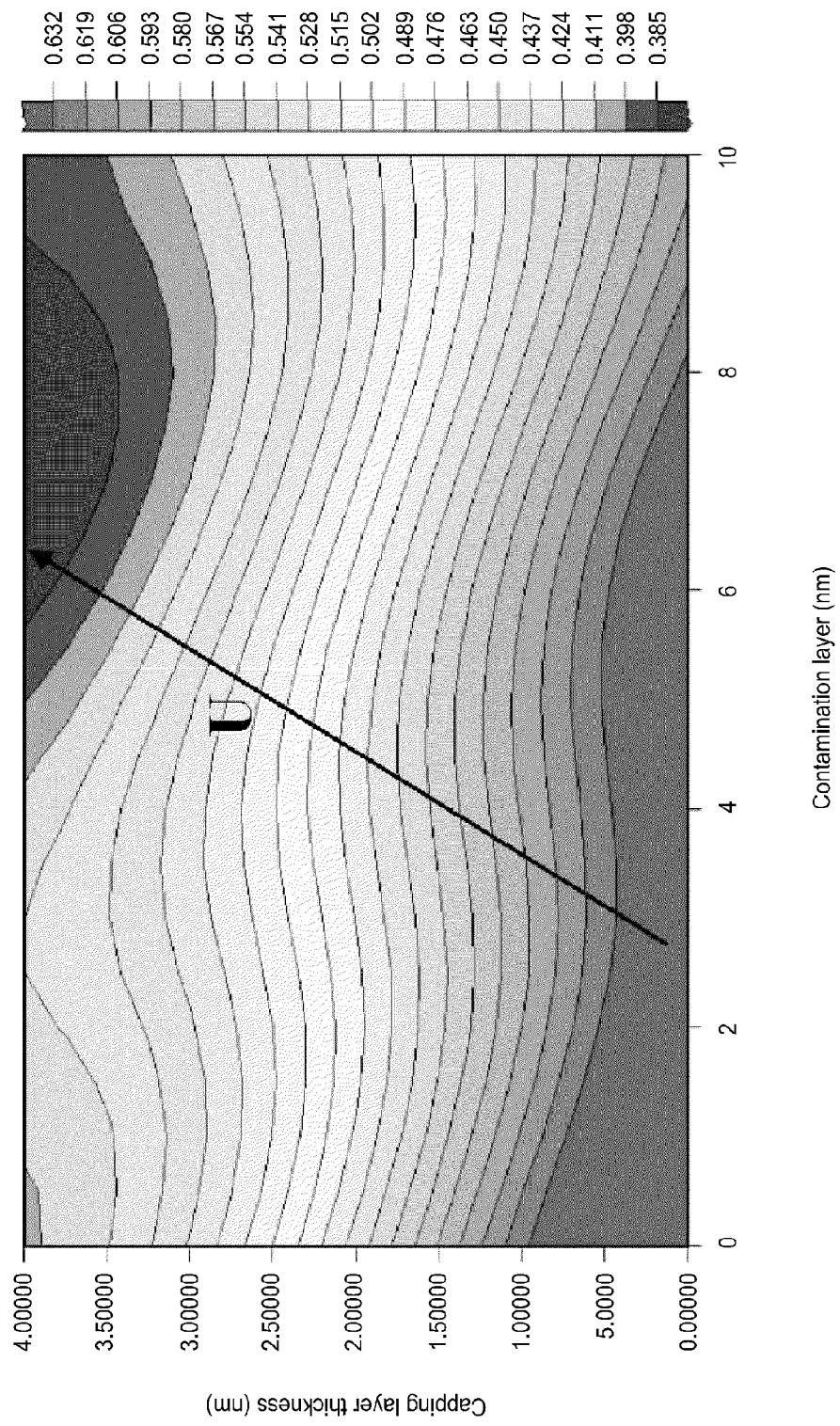
Figure 10B:
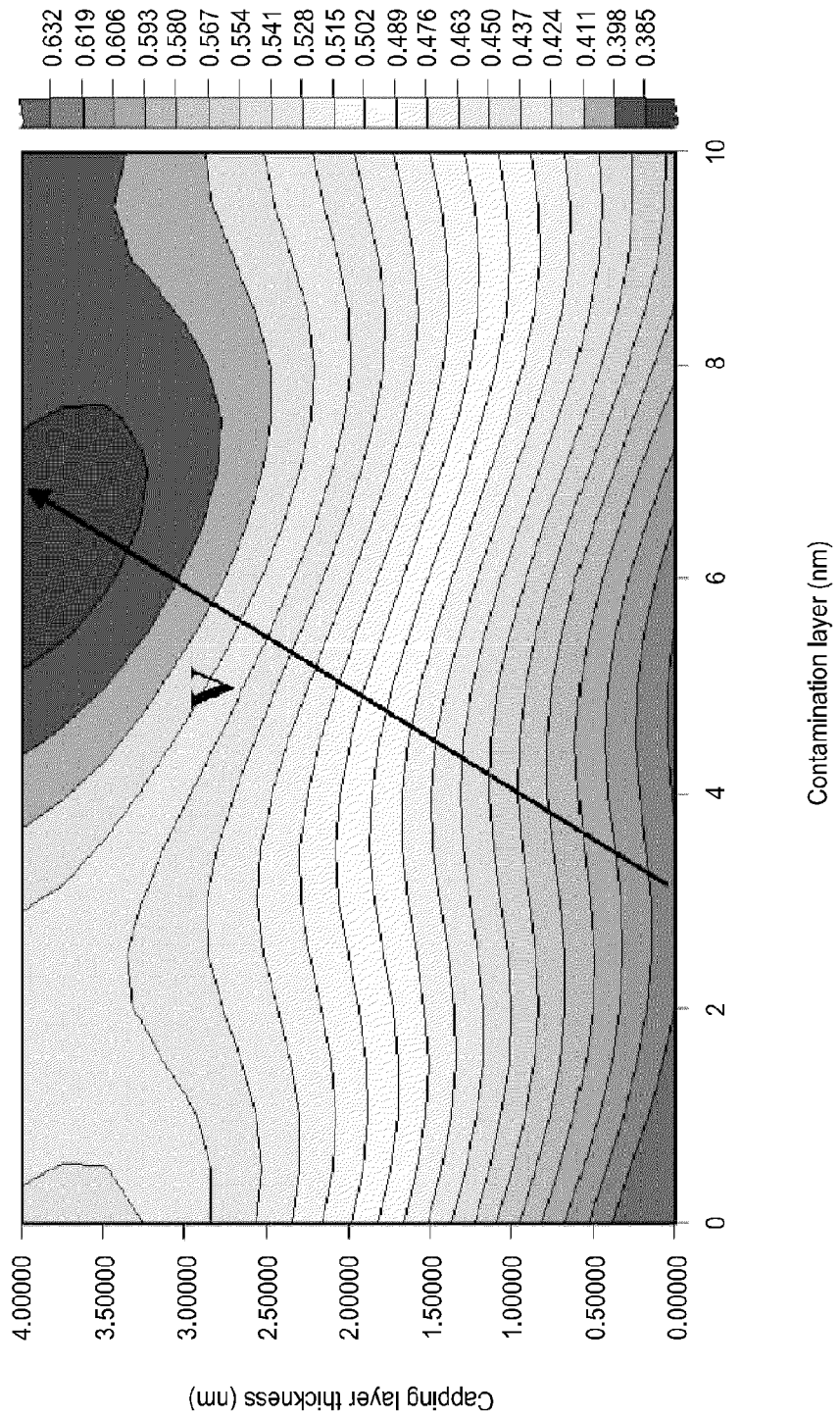

In a sixth example, the effect of oxidization for a ruthenium capping layer is illustrated. FIG. 10a and FIG. 10b illustrates the reflectivity of the sensor as described in FIG. 9a, but wherein the capping layer is a ruthenium capping layer with a ruthenium dioxide $RuO_2$ layer of respectively 1 nm and 2 nm thick. In FIG. 10a, the reflectivity along arrow U varies from approximately 63.9% to approximately 39.2% in steps of 1.3%. In FIG. 10b, the reflectivity along arrow V varies from approximately 63.9% to approximately 39.2% in steps of 1.3%.

Figure 11A:
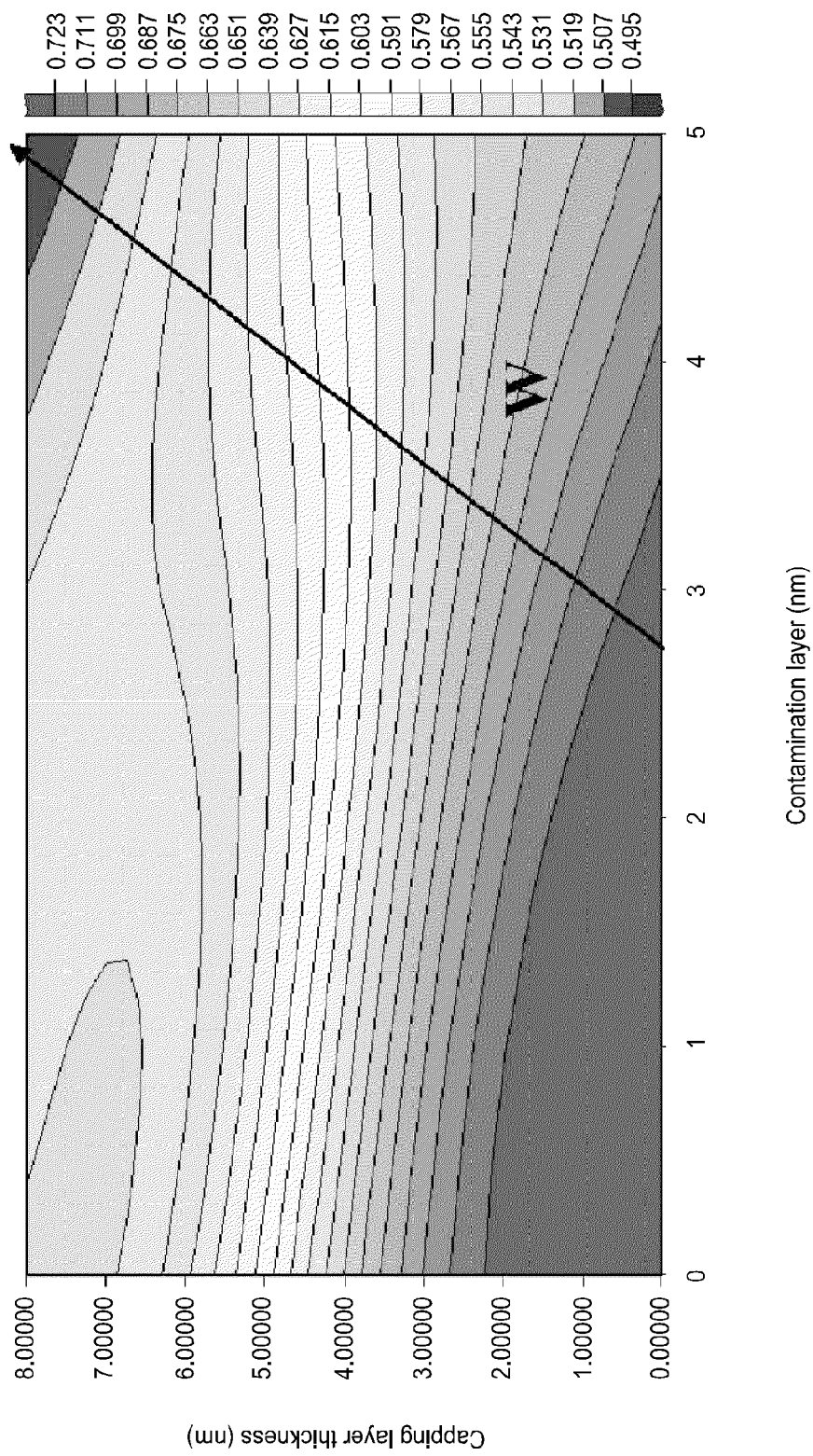
FIG. 11a to FIG. 11f illustrate the effect of the top layer used in a multi-layer coating of a reflective substrate and the use of different materials for the capping layer on the sensitivity of the reflectivity to deposition/formation of a contamination layer, illustrating principles that can be used in certain embodiments.
Figure 11B:
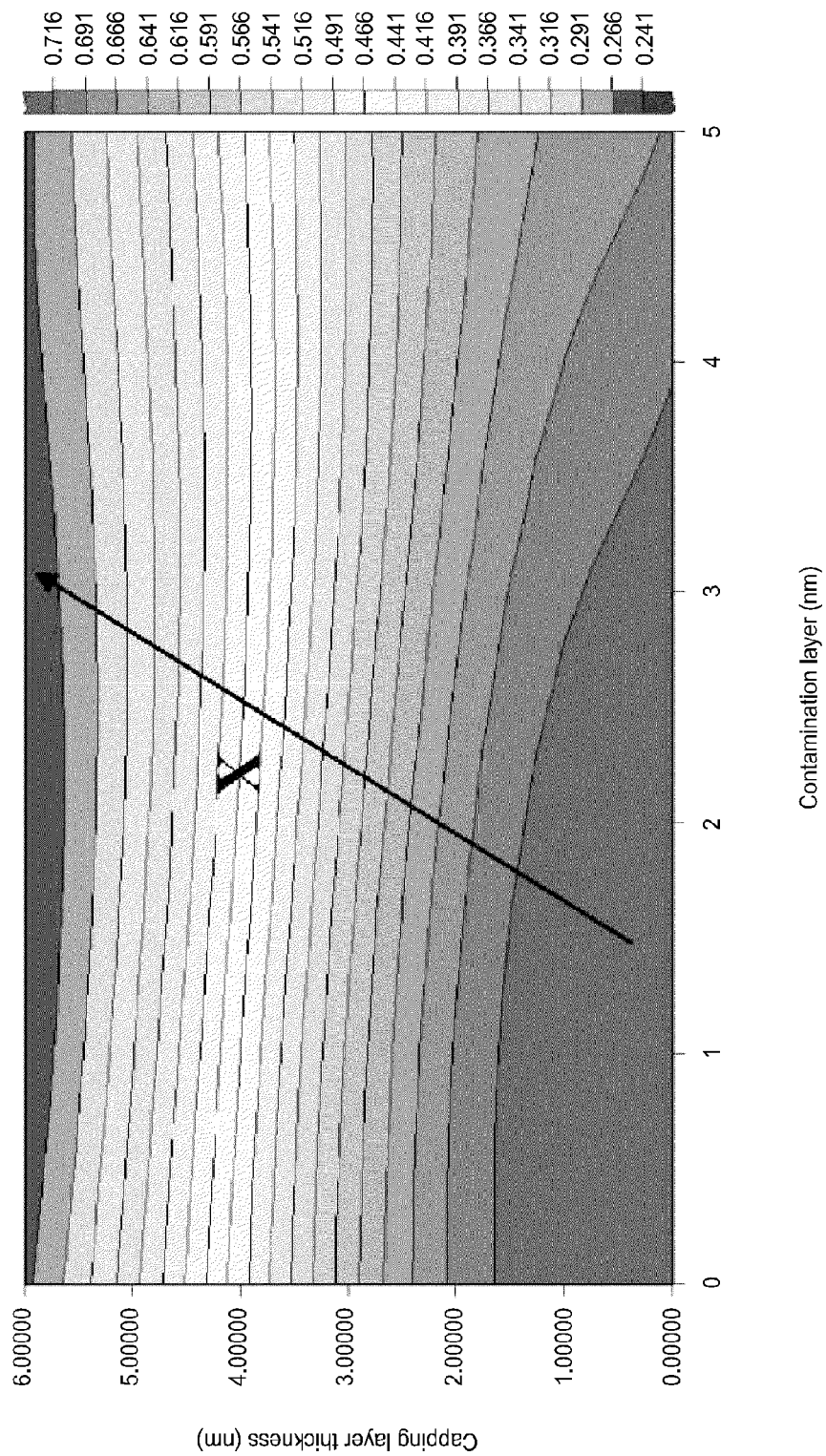
Figure 11C:
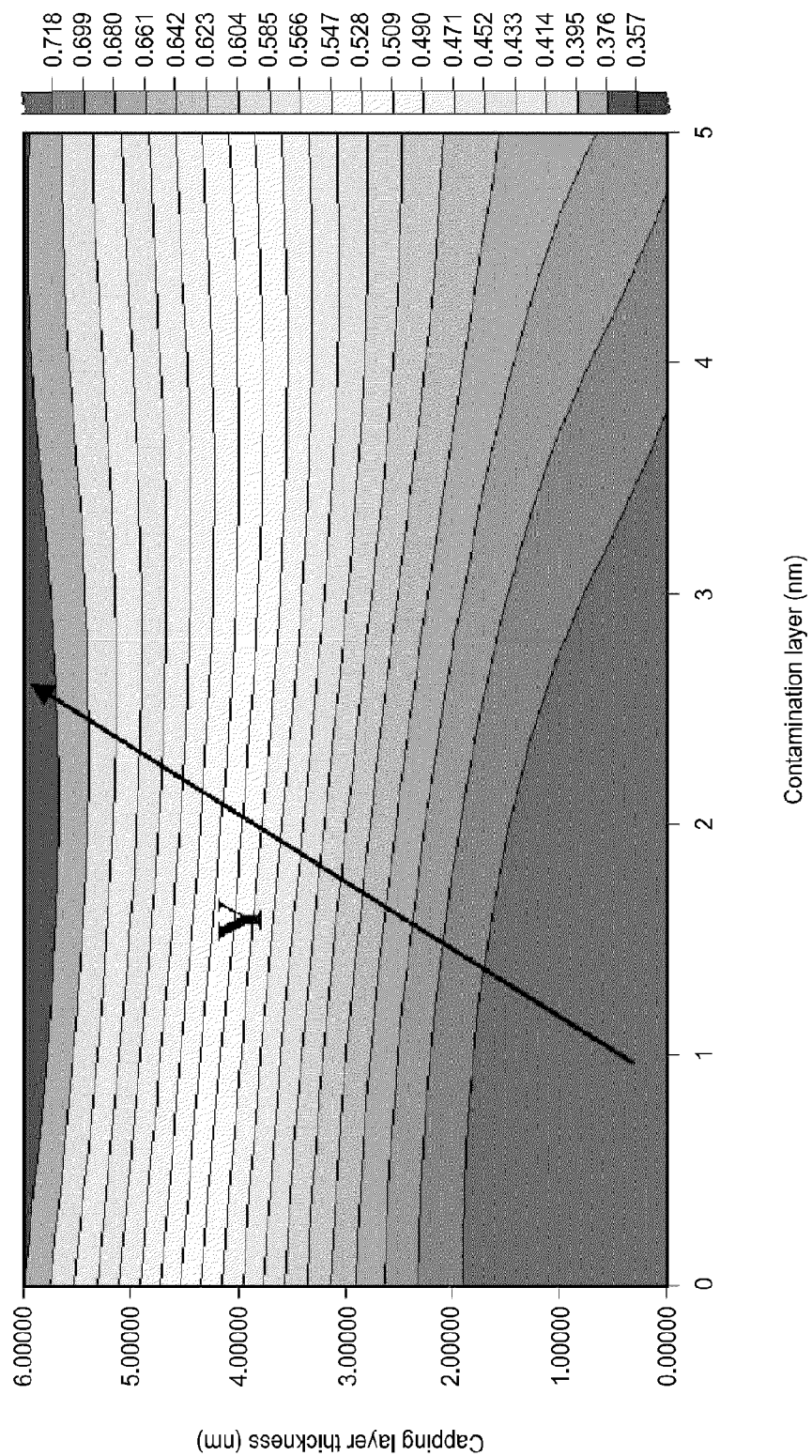
Figure 11D:
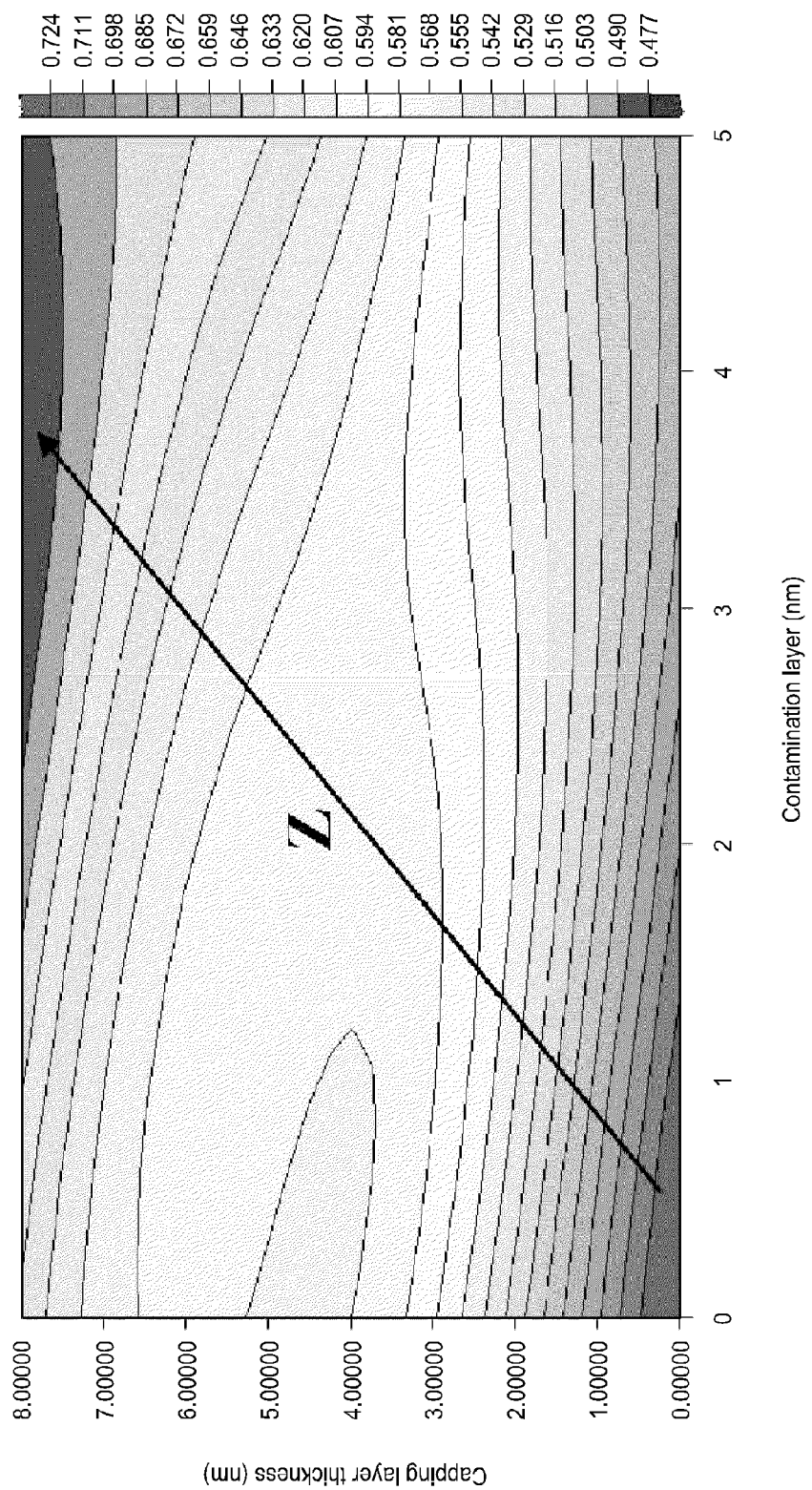
Figure 11E:
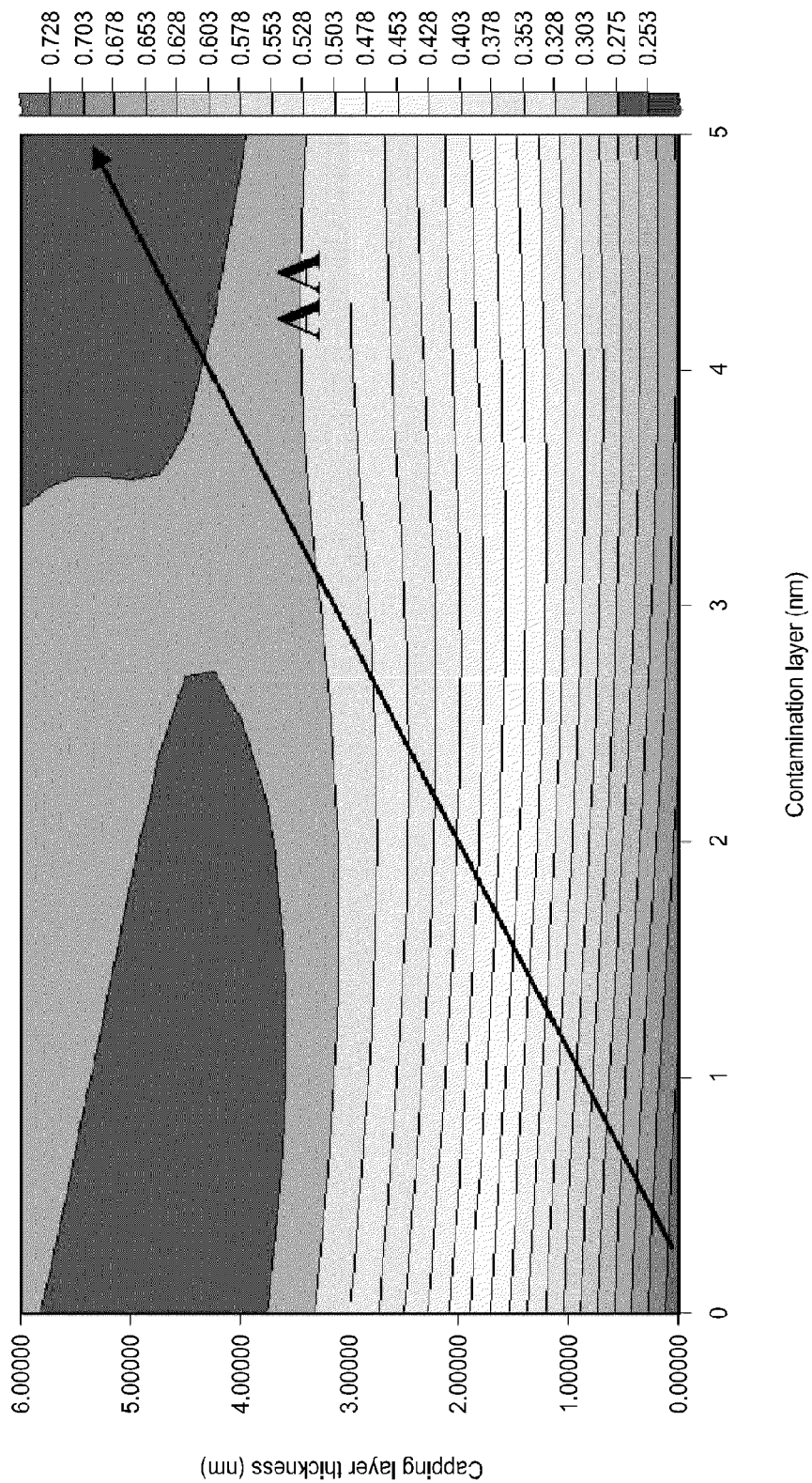
Figure 11F:
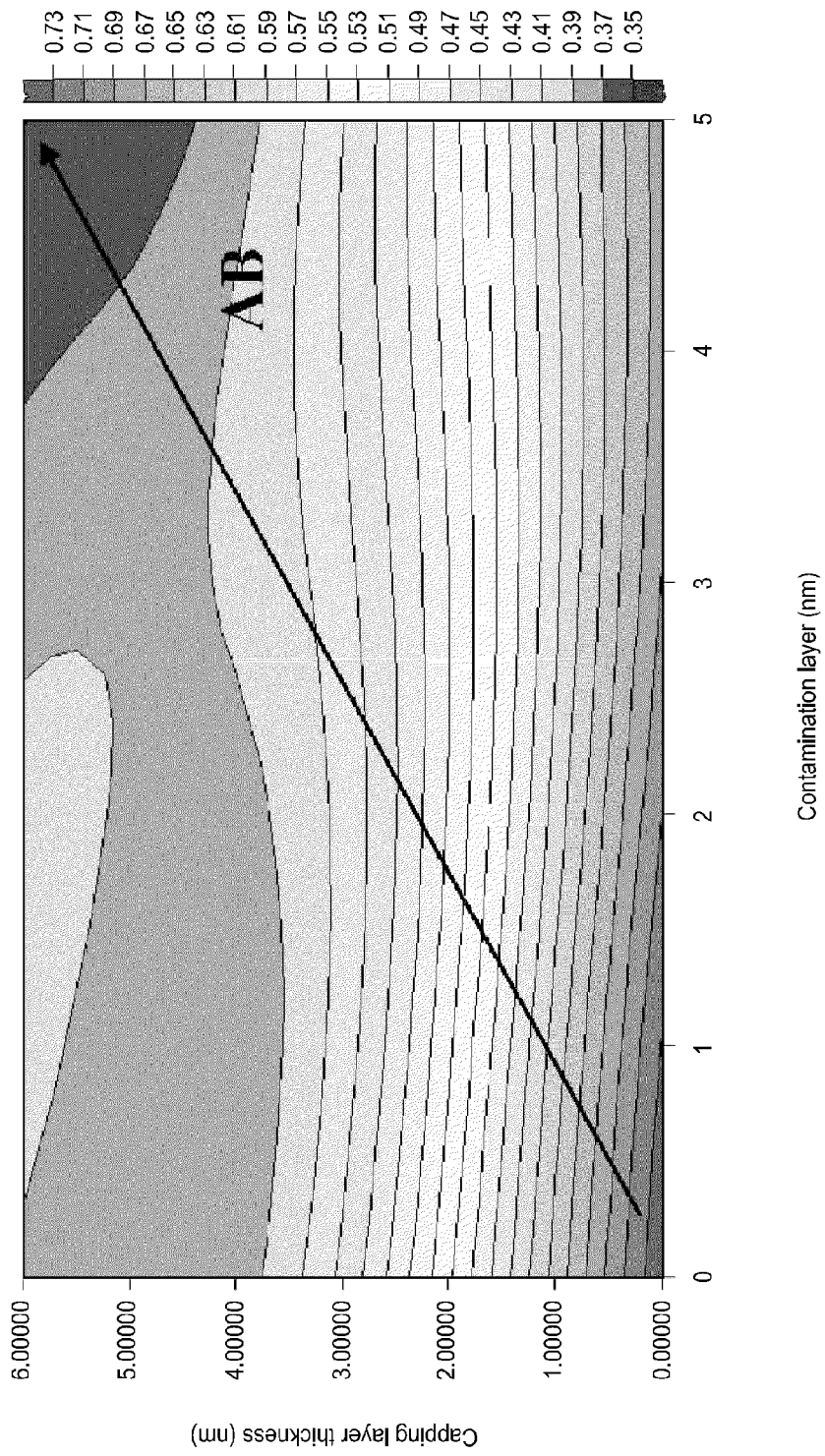

In a seventh example, the reflectivity of a sensor is shown as function of a contamination layer thickness and as function of a capping layer thickness. The structure studied again is a reflective substrate comprising a forty layer multi-layer of alternating molybdenum layers (3 nm thickness) and silicon layers (4 nm thickness). In FIG. 11a, FIG. 11b and FIG. 11c, the multi-layer stack is ended with a silicon layer with on top thereof respectively a titanium dioxide $TiO_2$ capping layer, a silver Ag capping layer or a gold Au capping layer. In FIG. 11a, the reflectivity along arrow W varies from approximately 71.7% to approximately 50.1% in steps of 1.2%. In FIG. 10b, the reflectivity along arrow X varies from approximately 70.3% to approximately 50.3% in steps of 2.5%. In FIG. 11c, the reflectivity along arrow Y varies from approximately 70.9% to approximately 36.7% in steps of 1.9%. FIG. 11d, FIG. 11e and FIG. 11f illustrates the reflectivity for the same sensor, whereby the multi-layer stack is ended with a molybdenum layer with on top thereof respectively a 3.7 nm titanium dioxide $TiO_2$ capping layer, a silver Ag capping layer or a gold Au capping layer. Whereas the titanium dioxide layer absorbs a lot, the sensitivity of the sensor to contamination is reduced to 1.3% for contamination layer thicknesses up to 5 nm. The latter illustrates that selection of particular types of capping layers with particular layer properties allows tuning the sensitivity to contamination. In FIG. 11d, the reflectivity along arrow Z varies from approximately 71.7% to approximately 48.3% in steps of 1.3%. In FIG. 11e, the reflectivity along arrow AA varies from approximately 71.5% to approximately 26.5% in steps of 2.5%. In FIG. 11f, the reflectivity along arrow AB varies from approximately 72% to approximately 36% in steps of 2%.

Figure 12:
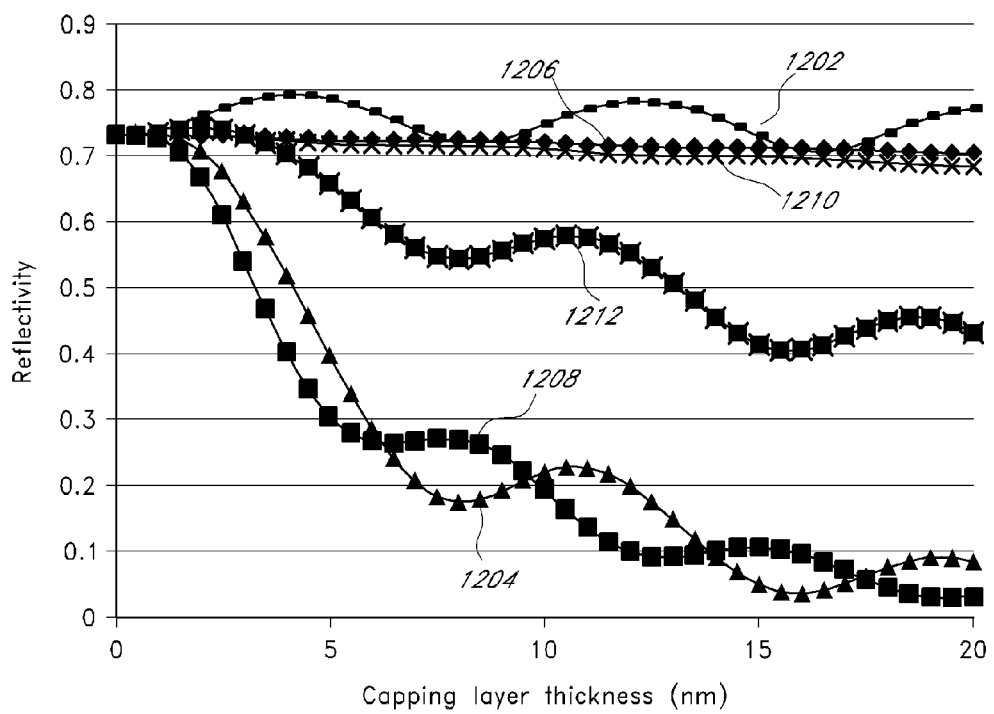
FIG. 12 illustrates the impact of the refractive index and the absorption coefficient of the capping layer for a sensor on the reflectivity, as can be used in certain embodiments.

In an eighth example, tuning of the refractive index (real part and imaginary part, the latter being the absorption coefficient) of the capping layer on top of a reflective substrate with a silicon top layer is illustrated. FIG. 12 illustrates the reflectivity as function of the capping layer thickness for a capping layer with real refractive index 0.85 and absorption coefficient 0.001 by curve 1202, a capping layer with real refractive index 0.85 and absorption coefficient 0.08 by curve 1204, a capping layer with real refractive index 1 and absorption coefficient 0.001 by curve 1206 and a capping layer with real refractive index 1 and absorption coefficient 0.08 by curve 1208. Optional capping layers that can be used may have a real refractive index between 1 and 0.85 and an absorption coefficient between 0.001 and 0.08. Explicit examples of capping layers may be a silicon top on a reflective substrate as illustrated by curve 1210 or a ruthenium top on a silicon top layer as illustrated by curve 1212. It has been established that the oscillating reflectivity function has a period significantly determined by the real part of the refractive index n, an amplitude depending on the real part of the refractive index n and the imaginary part of the refractive index k. The decreasing reflectivity function is significantly determined by the absorption coefficient k.

In certain embodiments, thin film interference effects are used for tuning the sensitivity to contamination formation.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope. For example, any formulas given above are merely representative of procedures that may be used. Functionality may be added or deleted from the block diagrams and operations may be interchanged among functional blocks. Steps may be added or deleted to methods described within the scope of the present invention.

What is claimed is:

1. A sensor for sensing contamination in an application system, the sensor comprising:
   a substrate with a reflective multi-layer coating; and
   a capping layer,
   wherein one or more of the thickness, material, composition or refractive index of the capping layer is adapted to cause a first reflectivity change upon initial formation of a first contamination layer of a first thickness on the capping layer when the sensor is provided in the application system, the first reflectivity change being larger than an average reflectivity change upon further formation of a contamination layer having a thickness greater than the first thickness on the capping layer, and wherein a reflectivity of the sensor as a function of a thickness of a contamination layer on the capping layer is a superposition of a decreasing reflectivity function and an oscillating reflectivity function, the capping layer being adapted so that the reflectivity change of the sensor upon initial formation of the first contamination layer on the capping layer when the sensor is provided in the application system corresponds to a falling edge of the oscillating reflectivity function.

2. The sensor according to claim 1, wherein the reflectivity change upon initial contamination of the capping layer is at least about 0.5% reflectivity reduction per nanometer contamination layer thickness.

3. The sensor according to claim 1, wherein the capping layer comprises a substantially non-oxidizing material.

4. The sensor according to claim 1, wherein the capping layer comprises at least one of the following: silicon, ruthenium, titanium dioxide, rhodium, palladium, iridium, platinum, gold, silicon carbide, carbon, boron nitride, silicon nitride, and titanium nitride.

5. The sensor according to claim 1, wherein the capping layer is a top layer of the reflective multi-layer coating.

6. The sensor according to claim 1, the sensor further comprising a sub-layer between the capping layer and the reflective substrate.

7. A detection system for detecting contamination in an application system, the detection system comprising:
a sensor adapted for receiving an irradiation beam from an irradiation source and adapted for reflecting a modified irradiation beam to a radiation detector, the sensor comprising
a substrate with a reflective multi-layer coating, and
a capping layer, wherein one or more of the thickness, material, composition or refractive index of the capping layer is adapted to cause a first reflectivity change upon initial formation of a first contamination layer of a first thickness on the capping layer when the sensor is provided in the application system, the first reflectivity change being larger than an average reflectivity change upon further formation of a contamination layer having a thickness greater than the first thickness on the capping layer, wherein a reflectivity of the sensor as a function of a thickness of a contamination layer on the capping layer is a superposition of a decreasing reflectivity function and an oscillating reflectivity function, the capping layer being adapted so that the reflectivity change of the sensor upon initial formation of the first contamination layer on the capping layer when the sensor is provided in the application system corresponds to a falling edge of the oscillating reflectivity function; and
a processing system for deriving a contamination level as a function of a detected reflectivity of the sensor.

8. The detection system according to claim 7, wherein the processing system for deriving a contamination level is adapted for taking into account a correlation between the change in reflectivity and the thickness of the contamination layer formed on the sensor.

9. The detection system according to claim 7, wherein the processing system is adapted for taking into account a calibration measurement providing information regarding the initial reflectivity of the reflective substrate.

10. The detection system according to claim 7, the detection system further comprising a feedback providing system for providing feedback regarding the contamination to the application system.

11. The detection system according to claim 7, the detection system further comprising a contamination removal system for removing the contamination from the capping layer.

12. The detection system according to claim 7, wherein the capping layer is a top layer of the reflective multi-layer coating.

13. An extreme ultraviolet lithographic system comprising:
a plurality of mirrors, at least one of the mirrors comprising a reflective substrate and a capping layer provided on the reflective substrate, wherein the capping layer of the at least one mirror is adapted so as to cause a mirror reflectivity change upon initial formation of a first contamination layer on the capping layer of the at least one mirror; and
a sensor comprising a substrate with a reflective multi-layer coating and a second capping layer, wherein one or more of the thickness, material, composition or refractive index of the second capping layer is adapted to cause a first reflectivity change upon initial formation of a first contamination layer of a first thickness on the second capping layer, the first reflectivity change being larger than an average reflectivity change upon further formation of a contamination layer having a thickness greater than the first thickness on the second capping layer, wherein a reflectivity of the sensor as a function of a thickness of a contamination layer on the second capping layer is a superposition of a decreasing reflectivity function and an oscillating reflectivity function, the second capping layer being adapted so that the reflectivity change of the sensor upon initial formation of the first contamination layer on the second capping layer when the sensor is provided in the system corresponds to a falling edge of the oscillating reflectivity function, and wherein the mirror reflectivity change is substantially smaller than the first reflectivity change for the sensor.

14. An application system according to claim 13, further comprising:
a processing system for deriving a contamination level as a function of a detected reflectivity of the sensor; and
a feedback providing system for providing feedback regarding the contamination to the lithographic system and controlling an irradiation source of the lithographic system.

15. The system according to claim 13, wherein the second capping layer is a top layer of the reflective multi-layer coating.

16. A method of sensing contamination in an application system, the method comprising:
providing a sensor comprising a capping layer, and
sensing a first reflectivity change of the sensor upon initial formation of a first contamination layer of a first thickness on the capping layer when the sensor is provided in an application system, the first reflectivity change being larger than an average reflectivity change upon further formation of a contamination layer having a thickness greater than the first thickness on the capping layer, wherein a reflectivity of the sensor as a function of a thickness of a contamination layer on the capping layer is a superposition of a decreasing reflectivity function and an oscillating reflectivity function, the capping layer being adapted so that the reflectivity change of the sensor upon initial formation of the first contamination layer on the capping layer when the sensor is provided in the application system corresponds to a falling edge of the oscillating reflectivity function.

17. The method according to claim 16, the method further comprising determining a contamination quantity based on the sensed first reflectivity change.

18. The method according to claim 17, the method further comprising controlling the application system based on the determined contamination quantity.

19. A method of manufacturing a sensor for sensing contamination in an application system, the method comprising
obtaining a substrate; and
providing a capping layer on the substrate thus forming a sensor, the sensor being adapted to cause a first reflectivity change upon initial formation of a first contamination layer having a first thickness on the capping layer when the sensor is provided in the system, the first reflectivity change being larger than an average reflectivity change upon further formation of a contamination layer having a thickness greater than the first thickness on the capping layer, and wherein a reflectivity of the sensor as a function of a thickness of a contamination layer on the capping layer is a superposition of a decreasing reflectivity function and an oscillating reflectivity function, the capping layer being adapted so that the reflectivity change of the sensor upon initial formation of the first contamination layer on the capping layer when the sensor is provided in the application system corresponds to a falling edge of the oscillating reflectivity function.

* * * * *